(12) United States Patent
Park et al.

(10) Patent No.: US 11,981,848 B2
(45) Date of Patent: May 14, 2024

(54) QUANTUM DOTS AND ELECTRONIC DEVICE INCLUDING THE SAME

(71) Applicant: SAMSUNG ELECTRONICS CO., LTD., Suwon-si (KR)

(72) Inventors: Sung Jun Park, Hwaseong-si (KR); Junghwa Kim, Yongin-si (KR); Tae Gon Kim, Hwaseong-si (KR); Taekhoon Kim, Hwaseong-si (KR); Young Mo Sung, Suwon-si (KR); Nayoun Won, Yongin-si (KR); Dongjin Yun, Pohang-si (KR); Mi Hye Lim, Suwon-si (KR); Shin Ae Jun, Seongnam-si (KR); Hyeonsu Heo, Uijeongbu-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 363 days.

(21) Appl. No.: 17/238,538

(22) Filed: Apr. 23, 2021

(65) Prior Publication Data

US 2021/0355380 A1 Nov. 18, 2021

(30) Foreign Application Priority Data

May 18, 2020 (KR) .......................... 10-2020-0059375

(51) Int. Cl.
*C09K 11/56* (2006.01)
*B82Y 20/00* (2011.01)
(Continued)

(52) U.S. Cl.
CPC ............. *C09K 11/565* (2013.01); *B82Y 20/00* (2013.01); *B82Y 30/00* (2013.01); *B82Y 40/00* (2013.01); *H10K 50/115* (2023.02)

(58) Field of Classification Search
CPC ....... C09K 11/56; C09K 11/565; C09K 11/02; C09K 11/025; C09K 11/703;
(Continued)

(56) References Cited

U.S. PATENT DOCUMENTS 10,619,096 B2 4/2020 Park et al.
10,725,340 B2 7/2020 Park et al.
(Continued)

FOREIGN PATENT DOCUMENTS

KR 20160120359 A 10/2016
KR 20180094200 A 8/2018
(Continued)

OTHER PUBLICATIONS

Hwi-Jae Kim et al., "Emission Enhancement of Cu-Doped InP Quantum Dots through Double Shelling Scheme," Materials, Jul. 15, 2019, pp. 1-11, vol. 12 Issue No. 2267.
(Continued)

*Primary Examiner* — Cuong B Nguyen
(74) *Attorney, Agent, or Firm* — CANTOR COLBURN LLP

(57) ABSTRACT

A quantum dot including a semiconductor nanocrystal core including Group III-V compound, a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur, and a composite/electronic device. The quantum dot does not include cadmium and the first semiconductor nanocrystal shell includes a polyvalent metal dopant at an interface with the second semiconductor nanocrystal shell.

23 Claims, 10 Drawing Sheets

(51) Int. Cl.
 *B82Y 30/00* (2011.01)
 *B82Y 40/00* (2011.01)
 *H10K 50/115* (2023.01)

(58) Field of Classification Search
 CPC ............ C09K 11/883; B82B 1/00–008; B82B
 3/00–0095; C01P 2002/10–22; Y10S
 977/70–838; Y10S 977/773–777; H10K
 50/115; H10K 85/211–215; H10K 59/38;
 H10K 2102/321; C01B 32/152–156;
 H01L 21/02601–02606; B82Y 20/00;
 B82Y 30/00; B82Y 40/00
 See application file for complete search history.

(56) References Cited

U.S. PATENT DOCUMENTS

| | | | |
|---|---|---|---|
| 2017/0052444 A1 | 2/2017 | Park et al. | |
| 2018/0216003 A1 | 8/2018 | Zhang et al. | |
| 2019/0115550 A1 | 4/2019 | Kim et al. | |
| 2019/0169500 A1* | 6/2019 | Kim | ................. H10K 50/115 |
| 2019/0211262 A1 | 7/2019 | Park et al. | |
| 2020/0224095 A1* | 7/2020 | Hong | ................. B82Y 40/00 |
| 2020/0319516 A1 | 10/2020 | Park et al. | |
| 2022/0204800 A1* | 6/2022 | Pousthomis | ......... C09K 11/661 |

FOREIGN PATENT DOCUMENTS

| | | |
|---|---|---|
| KR | 20180108012 A | 10/2018 |
| KR | 20190042192 A | 4/2019 |
| KR | 20190085884 A | 7/2019 |
| KR | 1020190085886 A | 7/2019 |
| WO | 2017019789 A1 | 2/2017 |

OTHER PUBLICATIONS

J.A. Reyes-Retana et al., "Structural properties of amorphous selenium: An ab initio molecular-dynamics simulation," Computational Materials Science, Dec. 16, 2009, pp. 934-939, vol. 47.

Tonino Greco et al., "InP/ZnSe/ZnS core-multishell quantum dots for improved luminescence efficiency," Proc. of SPIE, May 1, 2021, pp. 1-9, vol. 8424, No. 842439.

\* cited by examiner

Pattern Preparation by using a photoresist

Repeating the Patterning Process three times

QUANTUM DOTS AND ELECTRONIC DEVICE INCLUDING THE SAME

CROSS-REFERENCE TO RELATED APPLICATION

This application claims priority to and the benefit of Korean Patent Application No. 10-2020-0059375 filed in the Korean Intellectual Property Office on May 18, 2020, and all the benefits accruing therefrom under 35 U.S.C. § 119, the entire content of which in its entirety is herein incorporated by reference.

BACKGROUND

1. Field

Quantum dot, a composition or a composite including the same, and an electronic device including the same are disclosed.

2. Description of the Related Art

A quantum dot ("QD") is a nanocrystal of semiconductor material with a diameter of about several nanometers to several tens of nanometers (i.e., a nano-sized semiconductor nanocrystal), which exhibits a quantum confinement effect. Quantum dots may have different bandgap energies by controlling sizes and compositions of nanocrystals, and thus may emit light of various photoluminescence wavelengths. Quantum dots may exhibit electroluminescence and photoluminescence properties. In a wet chemical synthesis process, organic materials such as dispersing agents are coordinated on, e.g., bound to, the surface of the semiconductor nanocrystal during crystal growth to provide quantum dots having controlled sizes and photoluminescence properties. Luminescence properties of quantum dots may be applied, e.g., used, in various fields. From an environmental point of view, developments for cadmium-free quantum dots capable of realizing, e.g., exhibiting, improved luminescence properties are desirable.

SUMMARY

An embodiment provides quantum dots capable of exhibiting improved luminescence properties and stability.

An embodiment provides a method of producing the quantum dots.

An embodiment provides a composition including the quantum dots.

An embodiment provides a quantum dot composite including the quantum dots.

An embodiment provides a laminated structure and an electronic device including the quantum dot composite.

An embodiment provides a core/shell quantum dot (or core/shell quantum dots, hereinafter referred to as a core/shell quantum dot) capable of exhibiting improved luminescence properties and stability.

An embodiment provides a method of producing the core/shell quantum dots.

An embodiment provides a composition including the core/shell quantum dots.

An embodiment provides a quantum dot composite including the core/shell quantum dots.

An embodiment provides a laminated structure including the quantum dot composite.

An embodiment provides an electronic device including the quantum dots or the quantum dot composite.

In an embodiment, a quantum dot includes a semiconductor nanocrystal core including a Group III-V compound, a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur, wherein the quantum dot does not include cadmium, and wherein the first semiconductor nanocrystal shell includes a polyvalent metal dopant at an interface with the second semiconductor nanocrystal shell.

The semiconductor nanocrystal core may include indium, phosphorus, and optionally zinc.

The second semiconductor nanocrystal shell may have a thickness of less than about 0.7 nanometers (nm).

In the quantum dot(s), a mole ratio of zinc relative to indium may be less than or equal to about 45:1.

In the quantum dot(s), a mole ratio of sulfur relative to selenium may be less than or equal to about 2.5:1, for example, less than or equal to about 2:1 or less than or equal to about 1.5:1.

In the quantum dot(s), a mole ratio of sulfur relative to selenium may be greater than or equal to about 0.1:1, greater than or equal to about 0.2:1, or greater than or equal to about 0.3:1.

In the quantum dot(s), a mole ratio of phosphorus relative to indium may be less than or equal to about 0.75:1.

In the quantum dot(s), a mole ratio of phosphorus relative to indium may be less than or equal to about 0.7:1.

The quantum dot(s) may not include copper, manganese, aluminum, magnesium, gallium, antimony, hafnium, zirconium, titanium, or a combination thereof.

The first semiconductor nanocrystal shell may include a second layer (e.g., directly) adjacent to the second semiconductor nanocrystal shell, a first layer (e.g., directly) adjacent to the semiconductor nanocrystal core, and a third layer disposed between the first layer and the second layer, wherein the second layer includes the polyvalent metal dopant and the third layer may not include the polyvalent metal dopant.

The polyvalent metal dopant may have an atomic radius of greater than or equal to about 1.45 angstroms.

The polyvalent metal dopant may have an atomic radius of less than or equal to about 2.18 angstroms (less than or equal to about 2 angstroms, less than or equal to about 1.9 angstroms, less than or equal to about 1.8 angstroms, or less than or equal to about 1.75 angstroms).

The polyvalent metal dopant may include In, Sc, Ti, V, Cr, Mn, Fe, Zr, Hf, Hg, Sn, Pb, Ga, Bi, Sm, Eu, Dg, Tb, Dy, Ho, Er, Tm, Yb, Lu, or a combination thereof.

The quantum dot(s) may have quantum efficiency of greater than or equal to about 89%.

The quantum dot(s) may have a full width at half maximum (FWHM) of less than or equal to about 40 nm.

A maximum luminescent peak of the quantum dot(s) may be present in a range of about 500 nm to about 560 nm.

A maximum luminescent peak of the quantum dot(s) may be present in a range of about 600 nm to about 650 nm.

In an embodiment, a core/shell quantum dot(s) (hereinafter, referred to as quantum dot) include(s) a semiconductor nanocrystal core including indium, phosphorus, and zinc; and a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur, wherein a doped layer including zinc chalcogenide and a polyvalent metal dopant is disposed between the first semiconductor nanocrystal shell and the second semiconductor nanocrystal shell.

The first semiconductor nanocrystal shell may not include a polyvalent metal dopant, the second semiconductor nanocrystal shell may not include a polyvalent metal dopant, or each of the first semiconductor nanocrystal shell and the second semiconductor nanocrystal shell may not comprise a polyvalent metal dopant.

The doped layer may be disposed directly on the first semiconductor nanocrystal shell. The second semiconductor nanocrystal shell may be disposed directly on the doped layer.

A maximum luminescent peak of the quantum dots may be present in a range of greater than or equal to about 520 nm and less than or equal to about 540 nm.

A maximum luminescent peak of the quantum dot(s) may have a full width at half maximum (FWHM) of less than or equal to about 40 nm. The quantum dots may have quantum efficiency of greater than or equal to about 90%.

In the quantum dot(s), a mole ratio of zinc relative to indium may be greater than or equal to about 18 and less than or equal to about 45:1.

In the quantum dot(s), a mole ratio of sulfur relative to selenium may be less than or equal to about 1:1.

In the quantum dots, a mole ratio of phosphorus relative to indium may be less than or equal to about 0.75:1.

In the quantum dot(s), a mole ratio of a total sum of selenium and sulfur relative to indium may be greater than or equal to about 16:1 and less than or equal to about 40:1.

The quantum dot(s) may have an average size of greater than or equal to about 5.5 nm, while emitting green light (e.g., in a wavelength range of greater than or equal to about 500 nm and less than or equal to about 560 nm).

The quantum dot(s) may not include copper, manganese, aluminum, magnesium, gallium, antimony, hafnium, zirconium, titanium, or a combination thereof.

The quantum dot(s) may be configured to exhibit (blue) light absorption ratio of greater than or equal to about 88%, or greater than or equal to about 88.5%, or greater than or equal to about 90% (e.g., in a quantum dot composite).

In an embodiment, a quantum dot composite includes a matrix (e.g., polymer matrix); and a plurality of quantum dots dispersed in the matrix, wherein the plurality of quantum dots may include the aforementioned quantum dots (or core/shell quantum dots).

The matrix may include a polymer.

The matrix may include a cross-linked polymer, a binder (monomer or polymer) having a carboxylic acid group, or a combination thereof.

The cross-linked polymer may include a polymerization product of a photopolymerizable monomer including a carbon-carbon double bond, a polymerization product of the photopolymerizable monomer and a polythiol compound having at least two thiol groups at a terminal end thereof, or a combination thereof.

The quantum dot composite may further include a metal oxide particulate dispersed in the matrix.

In an embodiment, a display device includes a light source and a luminescent element, wherein the luminescent element includes the aforementioned quantum dots or quantum dot composite, and the light source is configured to provide incident light to the luminescent element.

The incident light may have an emission peak wavelength in the range of about 440 nm to about 460 nm.

The luminescent element may include a sheet of the quantum dot composite.

The luminescent element may be a laminated structure including a substrate and a photoluminescent layer disposed on the substrate. The photoluminescent layer may include a pattern of the quantum dot composite. The pattern may include one or more repeating sections configured to emit light of a predetermined wavelength.

The display device may be configured to have color reproducibility of greater than or equal to about 80% based on BT2020.

In an embodiment, an electronic device includes a first electrode and a second electrode facing each other; and an active layer between the first electrode and the second electrode and including the aforementioned quantum dots.

The electronic device may further include a charge auxiliary layer (e.g., a hole auxiliary layer) between the first electrode and the active layer.

The electronic device may further include a charge auxiliary layer (e.g., an electron auxiliary layer) between the second electrode and the active layer.

The quantum dot(s) according to an embodiment has a shell with a controlled metal doping level and may exhibit improved luminescence properties (e.g., narrow full width at half maximum (FWHM) and luminous efficiency) and a desired emission wavelength. The quantum dots may be applied to, e.g., used in, various display devices and biological labeling (e.g., bio sensor or bio imaging, etc.), a photo detector, a solar cell, a hybrid composite, and the like. The quantum dots of an embodiment may have potential utility in a quantum dot-based photoluminescent type color filter. The photoluminescent type color filter may be utilized in various blue light sources, such as a blue light organic light emitting diode (OLED), a blue light emitting micro light emitting diode (LED), and a liquid crystal display device including a blue light source.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
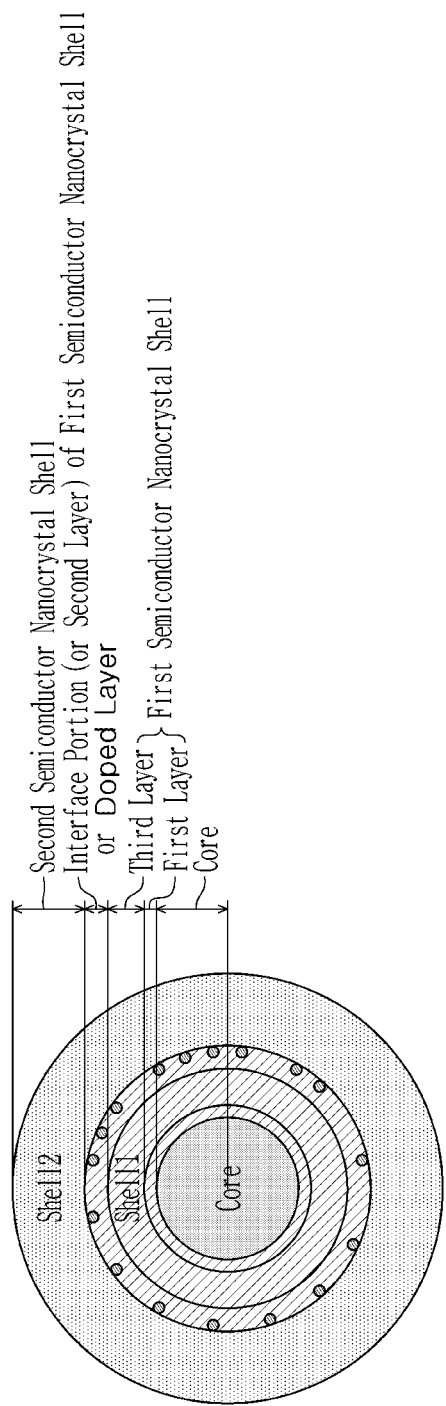
FIG. 1 is a schematic cross-sectional view of a quantum dot according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise", and variations such as "comprises" or "comprising", will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino or amine group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the prefix "hetero" refers to inclusion of one to three heteroatoms such as N, O, S, Si, or P.

In addition, when a definition is not otherwise provided, "aliphatic hydrocarbon group" refers to a C1 to C30 linear or branched alkyl group, a C1 to C30 linear or branched alkenyl group, or a C1 to C30 linear or branched alkynyl group.

As used herein, when a definition is not otherwise provided, "aromatic," refers to a C6 to C30 aryl group or a C2 to C30 heteroaryl group.

As used herein, when a definition is not otherwise provided, "(meth)acrylate" refers to acrylate, methacrylate, or a combination thereof.

As used herein, "Group" refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

The quantum efficiency of the quantum dot may be a quantum yield that can be readily and reproducibly measured by any suitable equipment, for example, from Hitachi Co. Ltd or Hamamatsu Co. Ltd and referring to the instruction manuals provided from the manufacturer. In an embodiment, the quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths, but are not limited thereto.

The full width at half maximum (FWHM) and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

Quantum dots are crystalline semiconductor materials (e.g., semiconductor nanocrystal particles) having a nanoscale size. Quantum dots may have a large surface area per unit volume and very small sizes and may exhibit a quantum confinement effect and different characteristics from bulk materials having the same composition. Quantum dots may absorb light from an excitation source to be excited, and may emit energy corresponding to bandgap energies of the quantum dots.

Quantum dots showing, e.g., exhibiting, optical properties applicable to, e.g., useful in, electronic devices may be cadmium-based. Cadmium may cause serious environment/health problems and thus is a restricted element. An example of a cadmium-free quantum dot is a Group III-V based nanocrystal, but is not limited thereto. Group III-V based (e.g., InP based) cadmium-free quantum dots may have unfavorable stability (e.g., chemical stability and thermal stability) compared to cadmium-based quantum dots, and luminescence properties may be easily and substantially deteriorated by a variety of processes for applying the same to an electronic device, e.g., luminescence properties of Group III-V based cadmium-free quantum dots may be deteriorated by a variety of processes for incorporating Group III-V based cadmium-free quantum dots in an electronic device. Luminescence properties and stability of an InP based cadmium-free quantum dot may be improved or secured by passivating the InP based core with a shell having an increased thickness. The shell may include a Group II-VI compound such as ZnS, ZnSe, and ZnSeS. The band level difference, e.g., band gap, between the core and the shell materials may be large enough to suppress exciton diffusion, and the crystal parameter difference from the InP core may also be high. Thereby, it may not be easy to uniformly provide these shells on the InP based core. In addition, it may be difficult to form a uniform In—P core particle due to a high covalent bonding property, and the surface thereof may have many defects. The drawbacks of the core may make the uniform passivation of the shell more difficult, and the produced shell may have defects.

The present inventors have surprisingly found that the luminous efficiency of quantum dots may be affected by the defects of the shell as well as the core, and when a layer including an metal dopant between the first sell and the second shell is provided by adding an additional metal dopant before forming a second shell and after forming a first shell in the core/shell quantum dots having a multi-layered shell, the quantum dots as prepared may exhibit increased efficiency together with improved full width at half maximum (FWHM).

Accordingly, (core/shell) quantum dots according to an embodiment (hereinafter, also referred to quantum dot, the terms of "quantum dot" which is a singular form may also mean a plurality of quantum dots as well as single quantum dot) may exhibit improved luminescence properties (narrow full width at half maximum (FWHM) and increased luminous efficiency) as well as not including cadmium and also emits light of a desired wavelength by having the composition which will be described herein. The quantum dots (e.g., including indium (In) and phosphorus (P)) includes a semiconductor nanocrystal core including a Group III-V compound and a shell disposed on the semiconductor nanocrystal core and including zinc, selenium, and sulfur. The shell includes a first semiconductor nanocrystal shell including zinc and selenium, and a second semiconductor nanocrystal shell disposed on the first semiconductor nanocrystal shell and including zinc and sulfur. The first semiconductor nanocrystal shell further includes a polyvalent metal dopant at the interface with the second semiconductor nanocrystal shell. (see FIG. 1)

In one embodiment, the semiconductor nanocrystal core may further include zinc. The semiconductor nanocrystal core may include InP, InZnP, or a combination thereof.

A size of the core may be appropriately selected taking into consideration a photoluminescence wavelength. For example, the size of the core may be greater than or equal to about 1 nm, greater than or equal to about 1.5 nm, greater than or equal to about 2 nm, or greater than or equal to about 2.1 nm. For example, the size of the core may be less than or equal to about 5 nm, less than or equal to about 4 nm, less than or equal to about 3 nm, less than or equal to about 2.5 nm, less than or equal to about 2.3 nm, or less than or equal to about 2.2 nm.

The shell (e.g., the first and second semiconductor nanocrystal shells) may have a thickness of about 10 monolayers (ML) or less, about 9 ML or less, about 8 ML or less, about 7 ML or less, about 6.5 ML or less, about 6 ML or less, about 5 ML or less, about 5.5 ML or less, about 4 ML or less, or about 4.5 ML or less. The shell may have a thickness of about 2 ML or more, about 2.5 ML or more, about 3 ML or more, or about 3.5 ML or more.

The shell may have a thickness of less than or equal to about 2.3 nm, for example, less than or equal to about 2.2 nm, less than or equal to about 2.1 nm, less than or equal to about 2 nm, less than or equal to about 1.9 nm, less than or equal to about 1.8 nm, less than or equal to about 1.7 nm, less than or equal to about 1.6 nm, less than or equal to about 1.5 nm, or less than or equal to about 1.4 nm. The shell may have a thickness of greater than or equal to about 0.5 nm, greater than or equal to about 0.6 nm, greater than or equal to about 0.7 nm, greater than or equal to about 0.8 nm, greater than or equal to about 0.9 nm, or greater than or equal to about 1 nm.

The shell has a multi-layered structure. The shell includes a first semiconductor nanocrystal shell disposed on the semiconductor nanocrystal core, a first semiconductor nanocrystal shell including zinc and selenium, and a second semiconductor nanocrystal shell adjacent to the first semiconductor nanocrystal shell and including zinc and sulfur. The first semiconductor nanocrystal shell may further include sulfur. The composition of the second semiconductor nanocrystal shell is different from that of the first semiconductor nanocrystal shell.

The first semiconductor nanocrystal shell (shell 1) may be disposed directly on the semiconductor nanocrystal core. The second semiconductor nanocrystal shell (shell 2) may be an outermost layer of the quantum dots. The first semiconductor nanocrystal shell may be adjacent to the second semiconductor nanocrystal shell, and includes a polyvalent metal dopant at an interface with the second semiconductor nanocrystal shell. The first semiconductor nanocrystal shell may include a second layer adjacent to the second semiconductor nanocrystal shell, a first layer adjacent to the semiconductor nanocrystal core, and a third layer disposed between the first layer and the second layer. The second layer may include the polyvalent metal dopant and the third layer may not include the polyvalent metal dopant. (see FIG. 1)

Accordingly, in an embodiment, a (core/shell) quantum dot(s) includes (include) a semiconductor nanocrystal core including indium, phosphorus, and optionally zinc; and a first semiconductor nanocrystal shell layer disposed on the semiconductor nanocrystal core and including zinc and selenium and a second semiconductor nanocrystal shell disposed on the first semiconductor nanocrystal shell layer and including zinc and sulfur, wherein a doped layer including a zinc chalcogenide and a polyvalent metal dopant may be disposed between the first semiconductor nanocrystal shell layer and the second semiconductor nanocrystal shell. (see FIG. 1)

The first semiconductor nanocrystal shell may have a thickness (or a thickness of a total sum of the first semiconductor nanocrystal shell layer and the doped layer) of about 7 monolayers (ML) or less, about 6 ML or less, about 5 ML or less, about 4.5 ML or less, about 4 ML or less, about 3.5 ML or less, or about 3 ML or less. The first semiconductor nanocrystal shell may have a thickness of about 1 ML or more, about 1.5 ML or more, about 2 ML or more, about 2.5 ML or more, or about 3 ML or more.

As used herein, the term monolayer refers to a measurement unit of shell thickness derived from the bulk crystal structure of the shell material as the closest distance between relevant lattice planes.

The first semiconductor nanocrystal shell may have a thickness (or a thickness of a total sum of the first semiconductor nanocrystal shell layer and the doped layer) may be less than or equal to about 3 nm, less than or equal to about 2.5 nm, less than or equal to about 2 nm, less than or equal to about 1.7 nm, less than or equal to about 1.5 nm, less than or equal to about 1.3 nm, less than or equal to about 1.1 nm, or less than or equal to about 1 nm. The first semiconductor nanocrystal shell may have a thickness of greater than or equal to about 0.5 nm, greater than or equal to about 0.7 nm, greater than or equal to about 1 nm, greater than or equal to about 1.1 nm, greater than or equal to about 1.2 nm, greater than or equal to about 1.3 nm, greater than or equal to about 1.4 nm, or greater than or equal to about 1.5 nm.

Each thickness of the doped layer or second layer may be appropriately adjusted in view of the thickness of the entire first shell. The thickness of the doped layer or second layer may be greater than or equal to about 0.1 nm, greater than or equal to about 0.2 nm, greater than or equal to about 0.3 nm, greater than or equal to about 0.4 nm, or greater than or equal to about 0.5 nm. The thickness of the doped layer or second layer may be less than or equal to about 1 nm, less than or equal to about 0.9 nm, less than or equal to about 0.8 nm, less than or equal to about 0.7 nm, less than or equal to about 0.6 nm, less than or equal to about 0.5 nm, less than or equal to about 0.4 nm, less than or equal to about 0.3 nm, less than or equal to about 0.2 nm, or less than or equal to about 0.1 nm.

The second semiconductor nanocrystal shell may have a thickness of about 3 ML or less, or about 2 ML or less. The second semiconductor nanocrystal shell may have a thickness of less than or equal to about 1 nm, less than or equal to about 0.9 nm, less than or equal to about 0.8 nm, less than or equal to about 0.7 nm, or less than or equal to about 0.6 nm. The second semiconductor nanocrystal shell may have a thickness of greater than or equal to about 0.2 nm, greater than or equal to about 0.3 nm, or greater than or equal to about 0.35 nm. The second semiconductor nanocrystal shell may have a thickness of about 0.5 ML or more, about 1 ML or more, or about 1.5 ML or more.

The present inventors have surprisingly found that when the first semiconductor nanocrystal shell includes a polyvalent metal dopant at the interface with the second semiconductor nanocrystal shell, the dopant may help the final quantum dots to exhibit increased full width at half maximum (FWHM) with maintaining the improved luminous efficiency. Without being bound by any particular theory, it is believed that the outermost layer of the first semiconductor nanocrystal shell may have a structural characteristic of an amorphous selenium compound, and may have a cycle-shaped (or open or closed loop or ring-shaped), e.g., circular, structure having an opening of about 3 angstroms to 4.5 angstroms, wherein the polyvalent metal dopants may be introduced into the opening of the cycle (open or closed loop or ring), e.g., circular, shape, and whereby a quality (e.g., uniformity) of the second semiconductor nanocrystal shell may be improved, which will be described herein.

The polyvalent metal dopant may have an atomic radius of greater than or equal to about 1.45 angstroms, for example, greater than or equal to about 1.50 angstroms, greater than or equal to about 1.55 angstroms, greater than or equal to about 1.60 angstroms, or greater than or equal to about 1.65 angstroms. The polyvalent metal dopant may have an atomic radius of less than or equal to about 2.18 angstroms, for example, less than or equal to about 2 angstroms, less than or equal to about 1.8 angstroms, less than or equal to about 1.75 angstroms, or less than or equal to about 1.7 angstroms.

The polyvalent metal dopant may include In, Sc, Ti, V, Cr, Mn, Fe, Zr, Hf, Hg, Sn, Pb, Ga, Bi, Sm, Eu, Dg, Tb, Dy, Ho, Er, Tm, Yb, Lu, or a combination thereof.

The polyvalent metal dopant may include indium.

The presence of the polyvalent metal dopant may be confirmed by chemical etching and inductively coupled plasma (ICP) analysis of the shell of the quantum dot. For example, when ICP analysis is performed while etching the quantum dot using an alkaline solution having a predetermined concentration (e.g., a concentration of less than or equal to about 1.0 M (molar (moles per liter)), for example, less than or equal to about 0.5 M, less than or equal to about 0.4 M, less than or equal to about 0.3 M, or less than or equal to about 0.2 M) and an acidic solution having a predetermined concentration (a diluted hydrochloric acid solution, a diluted nitric acid solution, etc.), the presence thereof at the interface of the second semiconductor nanocrystal shell and the first semiconductor nanocrystal shell may be confirmed. The solution may include a C1 to C5 alcohol solvent, water, or a combination thereof.

In an embodiment, the analysis may include etching using a diluted acidic solution, and subsequent etching using an alkaline solution. The analysis may further include etching using an acidic solution of increased concentration (e.g., greater than or equal to about 0.5 M, greater than or equal to about 1 M; less than or equal to about 10 M, less than or equal to about 9 M, less than or equal to about 8 M, less than or equal to about 7 M, less than or equal to about 6 M, less than or equal to about 5 M, less than or equal to about 4 M, less than or equal to about 3 M, less than or equal to about 2 M, or less than or equal to about 1 M; or a combination thereof) after etching with an alkali solution.

In the chemical etching and the ICP analysis of quantum dots according to an embodiment, there are a first section in which S, Zn, and optionally a trace amount of Se, a second section in which Zn, Se, and In are detected simultaneously and optionally together with a trace amount of S, and subsequently, and a third section in which Zn and Se and optionally a trace amount of S are only detected, but In is not detected, wherein the second section may be interpreted as an interface portion of the first semiconductor nanocrystal shell and the second semiconductor nanocrystal shell.

Therefore, a content of the polyvalent metal dopant at the interface portion between the first/second semiconductor nanocrystal shells (as confirmed by chemical etching and ICP analysis) may be greater than or equal to about 0.001 mole percent (mol %), greater than or equal to about 0.005 mol %, greater than or equal to about 0.009 mol %, greater than or equal to about 0.01 mol %, greater than or equal to about 0.03 mol %, greater than or equal to about 0.05 mol %, greater than or equal to about 0.07 mol %, greater than or equal to about 0.1 mol %, greater than or equal to about 0.2 mol %, greater than or equal to about 0.3 mol %, greater than or equal to about 0.4 mol %, greater than or equal to about 0.5 mol %, greater than or equal to about 0.6 mol %, greater than or equal to about 0.7 mol %, greater than or equal to about 0.8 mol %, greater than or equal to about 0.9 mol %, greater than or equal to about 1 mol %, or greater than or equal to about 1.5 mol % relative to selenium. The content of the polyvalent metal dopant may be less than or equal to about 40 mol %, less than or equal to about 30 mol %, less than or equal to about 20 mol %, less than or equal to about 10 mol %, less than or equal to about 9 mol %, less than or equal to about 8 mol %, less than or equal to about 7 mol %, less than or equal to about 6 mol %, less than or equal to about 5 mol %, less than or equal to about 4 mol %, less than or equal to about 3 mol %, less than or equal to about 2 mol %, or less than or equal to about 1.5 mol % relative to selenium.

In the quantum dots of an embodiment, a mole ratio (S:Se) of sulfur relative to selenium may be less than or equal to about 2.5:1, less than or equal to about 2.0:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1. In the quantum dots of an embodiment, a mole ratio of sulfur relative to selenium may be greater than or equal to about 0.05:1, greater than or equal to about 0.07:1, greater than or equal to about 0.1:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, or greater than or equal to about 0.9:1.

In the quantum dots of an embodiment, a mole ratio (Zn:In) of zinc relative to indium may be less than or equal to about 50:1, less than or equal to about 45:1, less than or equal to about 40:1, less than or equal to about 35:1, less than or equal to about 30:1, or less than or equal to about 25:1. In the quantum dots of an embodiment, a mole ratio of zinc relative to indium may be greater than or equal to about 10:1, greater than or equal to about 11:1, greater than or equal to about 12:1, greater than or equal to about 13:1, greater than or equal to about 14:1, greater than or equal to about 15:1, greater than or equal to about 16:1, greater than or equal to about 17:1, or greater than or equal to about 18:1.

In the quantum dots of an embodiment, a mole ratio (P:In) of phosphorus relative to indium may be greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.62:1, or greater than or equal to about 0.65:1. In the quantum dots of an embodiment, a mole ratio of phosphorus relative to indium may be less than or equal to about 1:1, less than or equal to about 0.98:1, less than or equal to about 0.95:1, less than or equal to about 0.9:1, less than or equal to about 0.85:1, less than or equal to about 0.8:1, less than or equal to about 0.75:1, less than or equal to about 0.7:1, or less than or equal to about 0.68:1.

In the quantum dots, a mole ratio (In:(S+Se)) of indium relative to a chalcogen element (e.g., sum of S and Se) may be greater than or equal to about 0.01:1, greater than or equal to about 0.02:1, greater than or equal to about 0.03:1, greater than or equal to about 0.04:1, greater than or equal to about 0.05:1, or greater than or equal to about 0.06:1 and less than or equal to about 0.15:1, less than or equal to about 0.14:1, less than or equal to about 0.13:1, less than or equal to about 0.12:1, less than or equal to about 0.11:1, less than or equal to about 0.105:1, less than or equal to about 0.1:1, less than or equal to about 0.095:1, less than or equal to about 0.09:1, less than or equal to about 0.085:1, less than or equal to about 0.08:1, or less than or equal to about 0.075:1.

The core/shell quantum dot(s) according to an embodiment having the aforementioned structure and composition may have improved luminous efficiency with a narrow full width at half maximum (FWHM) and may emit light of a desired wavelength (e.g., green light or red light). By having the aforementioned shell composition, the quantum dots according to an embodiment may provide a quantum dot composite with the improved luminous efficiency.

The quantum dots may have a size of greater than or equal to about 1 nm, greater than or equal to about 2 nm, greater than or equal to about 3 nm, greater than or equal to about 4 nm, or greater than or equal to about 5 nm. The quantum dots may have a size of less than or equal to about 30 nm, for example, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm. The size of the quantum dots may be a particle diameter. The size of the quantum dots (that do not have spherical shapes) may be diameters calculated by converting two-dimensional areas identified by transmission electron microscope analysis into circles. Dimensions such as sizes (e.g., quantum dot related dimensions) as used herein may refer to average dimensions (e.g., average sizes).

The quantum dots may have an (average) size of greater than or equal to about 4.3 nm, greater than or equal to about 5 nm, greater than or equal to about 5.5 nm, or greater than or equal to about 6 nm while emitting green light (e.g., wavelengths of greater than or equal to about 500 nm and less than or equal to about 560 nm).

The quantum dots may achieve a narrow level of full width at half maximum (FWHM) even when they have a relatively wide size distribution. A standard deviation of the sizes of the quantum dots may be greater than or equal to about 10%, greater than or equal to about 11%, or greater than or equal to about 12% of the (average) size. A standard deviation of the sizes of the quantum dots may be less than or equal to about 20%, less than or equal to about 19%, less than or equal to about 18%, less than or equal to about 17%, less than or equal to about 16%, or less than or equal to about 15% of the (average) size.

The quantum dots are not limited to particular shapes. They may have, for example, a spherical shape, a polyhedron, a pyramid, a multipod, a cube, a nanotube, a nanowire, a nanofiber, a nanosheet, or a combination thereof, but is not limited thereto.

The quantum dots may emit light having a wavelength of greater than or equal to about 500 nm and less than or equal to about 650 nm. The quantum dots may emit green light. The green light may have a maximum luminescent peak wavelength of greater than or equal to about 500 nm, greater than or equal to about 510 nm, greater than or equal to about 515 nm, greater than or equal to about 520 nm, greater than or equal to about 525 nm, or greater than or equal to about 527 nm. The green light may have a maximum luminescent peak wavelength of less than or equal to about 560 nm, less than or equal to about 550 nm, less than or equal to about 545 nm, less than or equal to about 540 nm, or less than or equal to about 530 nm.

In the ultraviolet-visible (UV-Vis) absorption spectrum of the quantum dots, the first absorption peak wavelength may be present in a range of greater than 450 nm and less than the photoluminescence peak wavelength. The first absorption peak wavelength may be, for example, present in a range of greater than or equal to about 455 nm, greater than or equal to about 460 nm, greater than or equal to about 465 nm, greater than or equal to about 470 nm, greater than or equal to about 475 nm, or greater than or equal to about 480 nm. The first absorption peak wavelength may be less than or equal to about 505 nm, less than or equal to about 500 nm, less than or equal to about 495 nm, or less than or equal to about 490 nm.

The (core/shell) quantum dots may have a valley depth of greater than or equal to about 0.45, or greater than or equal to about 0.5.

The quantum dots of an embodiment may have quantum efficiency (e.g., quantum yield (QY)) of greater than or equal to about 80%, greater than or equal to about 81%, greater than or equal to about 82%, greater than or equal to about 83%, greater than or equal to about 85%, greater than or equal to about 88%, greater than or equal to about 90%, greater than or equal to about 92%, greater than or equal to about 95%, or greater than or equal to about 95%.

The quantum dots may have a full width at half maximum (FWHM) of less than or equal to about 55 nm, for example, less than or equal to about 50 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, or less than or equal to about 38 nm.

The quantum dots may include the organic ligand, the organic solvent, or a combination thereof which will be described herein, on a surface thereof. The organic ligand, the organic solvent, or the combination thereof may be bound to the surfaces of the quantum dots.

A method of preparing the aforementioned quantum dot(s) according to an embodiment includes: preparing a semiconductor nanocrystal core including indium (In) and phosphorus (P), and optionally, zinc; reacting a zinc shell precursor, a selenium precursor, and optionally, a sulfur precursor (e.g., in organic solvent) under, e.g., in, the presence of a first organic ligand and the semiconductor nanocrystal core to provide a first semiconductor nanocrystal shell on the semiconductor nanocrystal core;

reacting the zinc shell precursor with the sulfur precursor under, e.g., in, the presence of the particle formed with the first semiconductor nanocrystal shell to provide a second semiconductor nanocrystal shell on the first semiconductor nanocrystal shell, wherein a precursor for a polyvalent metal dopant is injected after forming at least a part of the first semiconductor nanocrystal shell (e.g., first layer and third layer) and before forming the second semiconductor nanocrystal shell, and the first semiconductor nanocrystal shell includes the polyvalent metal dopant at an interface (e.g., second layer) with the second semiconductor nanocrystal shell (or a doped layer is formed between the first semiconductor nanocrystal shell and the second semiconductor nanocrystal shell).

The preparing of the semiconductor nanocrystal core is not particularly limited. In an embodiment, the preparing the semiconductor nanocrystal core may include heating an indium compound, optionally together with a zinc compound under, e.g., in, the presence of the second organic ligand and the organic solvent to prepare an indium precursor solution; and injecting the phosphorus precursor into the indium precursor solution to provide a mixture and heating the mixture. The method may further include preparing a zinc precursor separately, and injecting the same into the indium precursor solution or the obtained mixture. The zinc precursor may be obtained by heating the zinc compound and the organic ligand in an organic solvent at a high temperature (e.g., temperature of greater than or equal to about 100° C. and less than or equal to about 200° C.). The mole ratio of zinc relative to indium used for synthesizing a core may be appropriately adjusted, for example, greater than or equal to about 1:1, greater than about 1:1, greater than or equal to about 1.1:1, or greater than or equal to about 1.2:1 and less than or equal to about 3, less than or equal to about 2.5:1, or less than or equal to about 2:1, but is not limited thereto.

In an embodiment, the zinc precursor and the indium precursor may include a carboxylate moiety. The mole ratio of an organic ligand used when synthesizing the zinc precursor (or the indium precursor) may be greater than or equal to about 1:1, greater than or equal to about 1.5:1, or greater than or equal to about 2:1 and less than or equal to about 5:1, less than or equal to about 4:1, or less than or equal to about 3:1, but is not limited thereto.

In order to provide the first semiconductor nanocrystal shell, the reaction is carried out by heating a mixture including the zinc shell precursor, the first organic ligand, and the organic solvent; injecting the semiconductor nanocrystal core into the heated mixture, and injecting a selenium precursor and optionally a sulfur precursor at a desired ratio (and for example at least once or at least twice). In this case, after forming a shell material (i.e., first layer and third layer) of the desired thickness by injecting the selenium precursor, a precursor for the polyvalent metal dopant is injected to the reaction system, and the reaction is continued to provide a second layer.

Each injecting method of precursors is not particularly limited, but may be simultaneously or sequentially performed.

After providing the first semiconductor nanocrystal shell, the zinc precursor is reacted with the sulfur precursor (optionally, together with the selenium precursor) to provide a second semiconductor nanocrystal shell. The reaction system for providing the second semiconductor nanocrystal shell may not include a precursor for the polyvalent metal dopant.

The descriptions of the polyvalent metal dopant are the same as described herein. The precursor for the polyvalent metal dopant has a form of a compound including the aforementioned polyvalent metal. The compound may include a halide (e.g., chloride), a carboxylate compound, an alkylated metal, or a combination thereof. The dopant precursor is not particularly limited.

A used amount of the dopant precursor may be greater than or equal to about 0.01 weight percent (wt %), greater than or equal to about 0.1 wt %, greater than or equal to about 0.5 wt %, greater than or equal to about 1 wt %, greater than or equal to about 2 wt %, or greater than or equal to about 3 wt % based on the selenium precursor that will be described herein. The used amount of the dopant precursor may be less than or equal to about 10 wt %, less than or equal to about 9 wt %, less than or equal to about 8 wt %, less than or equal to about 7 wt %, or less than or equal to about 6 wt % based on the selenium precursor that will be described herein.

The types of the zinc precursor or zinc shell precursor (hereinafter, referred to as a zinc precursor) are not particularly limited and may be appropriately selected. For example, the zinc precursor may be a Zn metal powder, an alkylated Zn compound, Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. The zinc precursor may be dimethyl zinc, diethyl zinc, zinc acetate, zinc acetylacetonate, zinc iodide, zinc bromide, zinc chloride, zinc fluoride, zinc carbonate, zin cyanide, zinc nitrate, zinc oxide, zinc peroxide, zinc perchlorate, zinc sulfate, zinc oleate, and the like. The zinc precursor may be used alone or as a mixture of two or more zinc precursors.

The (first, second, or a combination thereof) organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $RHPOOH$ (wherein, R and R' are independently a C1 to C40 (or C3 to C24) aliphatic hydrocarbon group (e.g., an alkyl group, an alkenyl group, an alkynyl group, etc.), or C6 to C40 (or C6 to C24) aromatic hydrocarbon group (e.g., a C6 to C20 aryl group)), or a combination thereof. The organic ligand may coordinate, e.g., be bound to, the surface of the obtained nanocrystals and may help the nanocrystal to be well dispersed in the solution, affect light emitting and electrical characteristics of quantum dots, or a combination thereof. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, or dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphineoxide, etc.), substituted or unsubstituted ethyl phosphine oxide (e.g., triethyl phosphine oxide, ethyldiphenyl phosphineoxide, etc.), substituted or unsubstituted propyl phosphine oxide, substituted or unsubstituted butyl phosphine oxide, substituted or unsubstituted octyl phosphineoxide (e.g., trioctyl phosphine oxide (TOPO), and the like; a diphenyl phosphine, triphenyl phosphine, or an oxide thereof; phosphonic acid, a C5 to C20 alkylphosphinic acid such as hexylphosphinic acid, octyl phosphinic acid, dodecanephosphinic acid, tetradecanephosphinic acid, hexadecanephosphinic acid, octadecanephosphinic acid, and the like, or C5 to C20 alkyl phosphonic acid, but are not limited thereto. The organic ligand may be used alone or as a mixture of two or more organic ligands.

The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon group (e.g., alkane, alkene, alkyne, etc.) such as hexadecane, octadecane, octadecene, or squalane; a C6 to C30 aromatic hydrocarbon group such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide; a C12 to C22 aromatic ether such as phenyl ether, or benzyl ether, or a combination thereof. Types and amounts of the solvent may be appropriately selected taking into consideration precursors and organic ligands.

The indium compound is not particularly limited and may be appropriately selected. The indium precursor may include an indium powder, an alkylated indium compound, indium alkoxide, indium carboxylate, indium nitrate, indium percholate, indium sulfate, indium acetylacetonate, indium halide, indium cyanide, indium hydroxide, indium oxide, indium peroxide, indium carbonate, indium laurate, or a combination thereof. The indium precursor may include indium carboxylate such as indium oleate and indium myristate, indium acetate, indium hydroxide, indium chloride, indium bromide, and indium iodide. The formation of the indium precursor may be performed under vacuum at a temperature of greater than or equal to about 100° C., greater than or equal to about 120° C. and less than or equal to about 200° C.

The type of the phosphorus precursor is not particularly limited and may be appropriately selected. The phosphorus precursor is tris(trimethylsilyl) phosphine, tris(dimethylamino) phosphine, triethylphosphine, tributylphosphine, trioctylphosphine, triphenylphosphine, tricyclohexylphosphine, dimethyl aminophosphine, diethylaminophosphine, or a combination thereof.

A mixture obtained by injecting the phosphorus precursor during the core formation process may be heated to a temperature of greater than or equal to about 150° C., greater than or equal to about 200° C., greater than or equal to about 250° C., or greater than or equal to about 270° C. and less than or equal to about 300° C., less than or equal to about 290° C., less than or equal to about 280° C., less than or equal to about 270° C., or less than or equal to about 260° C.

A core formation reaction time is not particularly limited, and may be appropriately selected taking into consideration reactivity between precursors and core formation temperature.

The type of the selenium precursor is not particularly limited and may be appropriately selected. For example, the selenium precursor may include selenium-trioctylphosphine (Se-TOP), selenium-tributylphosphine (Se-TBP), selenium-triphenylphosphine (Se-TPP), tellurium-tributylphosphine (Te-TBP), or a combination thereof, but is not limited thereto. The selenium precursor may be injected once or more (e.g., twice or more).

The type of the sulfur precursor is not particularly limited and may be appropriately selected. The sulfur precursor injected for the second shell formation and optionally the first shell formation may include an organic solvent dispersion of sulfur powder (e.g., sulfur-octadecene (S-ODE), sulfur-trioctylphosphine (S-TOP), sulfur-tributylphosphine (S-TBP), sulfur-triphenylphosphine (S-TPP), sulfur-trioctylamine (S-TOA), or trimethylsilyl sulfur), mercapto propyl silane, trimethylsilyl sulfide, ammonium sulfide, sodium sulfide, or a combination thereof. The sulfur precursor may be injected once or more (e.g., twice or more).

The shell formation temperature may be appropriately selected. In an embodiment, the shell formation temperature may be greater than or equal to about 270° C., greater than or equal to about 280° C., greater than or equal to about 290° C., greater than or equal to about 300° C., greater than or equal to about 310° C., or greater than or equal to about 315° C. In an embodiment, the shell formation temperature may be less than or equal to about 350° C., less than or equal to about 340° C., less than or equal to about 330° C., or less than or equal to about 325° C.

The shell formation reaction time is not particularly limited and may be appropriately selected. For example, the shell forming reaction may be performed for, for example, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, greater than or equal to about 50 minutes, greater than or equal to about 55 minutes, or greater than or equal to about 1 hour, but is not limited thereto. The shell forming reaction time may be less than or equal to about 3 hours. Each precursor/compound may be added in a single step or for several times. When adding precursors or the like in a step-wise manner, the reaction is performed for a predetermined time (e.g., greater than or equal to about 5 minutes, greater than or equal to about 10 minutes, or greater than or equal to about 15) in each step. The reaction may be performed under an inert gas atmosphere or air or under the vacuum, but is not limited thereto.

During forming the first shell, the selenium precursor may be added thereto for one or more time (e.g., greater than or equal to about 2 times, greater than or equal to about 3 times). Depending upon the composition of the shell, the forming the second shell may be performed under, e.g., in, the presence of the selenium precursor or the absence thereof. According to the composition of the shell, the forming the first shell may be performed under, e.g., in, the presence of the sulfur precursor or the absence thereof.

When the forming the shell includes forming a first shell and forming a second shell, each reaction time may be appropriately chosen depending upon a desired composition of the shell, a type of the precursor, and the reaction temperature. The forming a shell (or forming a first shell and forming a second shell) may be performed for (e.g., independently to each other) greater than or equal to about 40 minutes, for example, greater than or equal to about 50 minutes, greater than or equal to about 60 minutes, greater than or equal to about 70 minutes, greater than or equal to about 80 minutes, or greater than or equal to about 90 minutes. The reaction time for forming a shell (or forming a first shell, forming a second shell, or forming each of a first shell and a second shell) may be (e.g., independently to each other) less than or equal to about 4 hours, for example, less than or equal to about 3 hours, less than or equal to about 2 hours, less than or equal to about 1 hour, or less than or equal to about 30 minutes.

In a reaction system for forming the first semiconductor nanocrystal shell, a content of the selenium precursor relative to indium may be adjusted to form a first semiconductor nanocrystal shell having a predetermined thickness for a predetermined reaction time. In reaction system for forming the first shell, a content of the selenium precursor relative to indium, that is, a content of selenium relative to 1 mole of indium may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles and less than or equal to about 20 moles, less than or equal to about 18 moles, or less than or equal to about 15 moles.

A reaction system for forming the second semiconductor nanocrystal shell may not include a selenium precursor.

In an embodiment, a content of the sulfur precursor relative to 1 mole of indium in the shell formation (e.g., second shell) reaction system may be adjusted (taking into consideration the reactivity and reaction temperature of the precursor) to obtain a desired shell composition. For example, in the shell formation (e.g., second shell) reaction system, an amount of the sulfur precursor relative to 1 mole of indium may be greater than or equal to 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles and less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

The addition of a nonsolvent to the prepared final reaction solution may allow nanocrystals coordinated with, e.g., bound to, the organic ligands to be separated (e.g., precipitated). The nonsolvent may be a polar solvent that is miscible with the solvent used in the reaction and nanocrystals are not dispersible therein. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the organic ligand may be used. Examples thereof may include hexane, heptane, octane, chloroform, toluene, and benzene.

The quantum dots may be dispersed in a dispersion solvent. The quantum dots may form an organic solvent dispersion. The organic solvent dispersion may not include water, an organic solvent miscible with water, or a combination thereof. The dispersion solvent may be appropriately selected. The dispersion solvent may include the aforementioned organic solvent. The dispersion solvent may include a substituted or unsubstituted C1 to C40 aliphatic hydrocarbon group, a substituted or unsubstituted C6 to C40 aromatic hydrocarbon group, or a combination thereof.

The composition of an embodiment includes (e.g., a plurality of) quantum dot(s) described herein; optionally a monomer, dispersing agent, or combination thereof; and a (organic) solvent, liquid vehicle, or a combination thereof.

The dispersing agent may disperse quantum dots. The dispersing agent may include a carboxylic acid group-containing compound (monomer or polymer). The composition may further include a (photo)polymerizable monomer including a carbon-carbon double bond, and optionally (thermal or photo) initiator. The composition may be a photosensitive composition.

Details of quantum dots in the composition are as described herein. The content of quantum dots in the composition may be appropriately adjusted taking into consideration the desired use (e.g., color filter, etc.). In an embodiment, the amount of the quantum dot may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on a solid content of the composition. The content of the quantum dots may be less than or equal to about 70 wt %, for example, 65 wt %, less than or equal to about 60 wt %, less than or equal to about 55 wt %, or less than or equal to about 50 wt % based on a solid content. The content based on a total solid content in the composition may correspond to the content of the corresponding component in the composite, which will be described herein.

In the composition according to an embodiment, the dispersing agent may contribute to ensuring dispersibility of the quantum dots. In an embodiment, the dispersing agent may include an organic compound (e.g., a monomer or polymer) (e.g., containing a carboxylic acid group). The binder polymer may be an insulating polymer.

The carboxylic acid group-containing organic compound may include a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group, or a copolymer thereof;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof. The dispersing agent may include the aforementioned first monomer, second monomer, and optionally third monomer.

In the composition, a content of the dispersing agent (or binder polymer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total weight of the composition, but is not limited thereto. The content of the dispersing agent (or binder polymer) may be less than or equal to about 35 wt %, for example, less than or equal to about 33 wt %, or less than or equal to about 30 wt % based on a total weight of the composition. The content of the dispersing agent (or binder polymer) may be about 0.5 wt % to about 55 wt % based on a total solid content weight of the composition.

The composition may include a polymerizable (e.g., photopolymerizable) monomer including the carbon-carbon double bond. The monomer may include (e.g., photopolymerizable) (meth)acryl-based monomer. The monomer may be a precursor for an insulating polymer.

A content of the monomer may be greater than or equal to about 0.5 wt %, for example, greater than or equal to about 1 wt % or greater than or equal to about 2 wt % based on a total weight of the composition. The content of the photopolymerizable monomer may be less than or equal to about 30 wt %, less than or equal to about for example, 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total weight of the composition.

The (photo)initiator in the composition may be used for (photo)polymerization of the aforementioned monomers The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, a content of the initiator may be appropriately adjusted taking into consideration types and contents of the polymerizable monomers. In an embodiment, the content of the initiator may be greater than or equal to about 0.01 wt %, for example, greater than or equal to about 1 wt %, and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or total solid content weight) of the composition, but is not limited thereto.

The composition may further include a (multiple or mono-functional) thiol compound having a, e.g., at least one, thiol group, for example, at a terminal end thereof, a metal oxide particulate, or a combination thereof.

The metal oxide particulate may include $TiO_2$, $SiO_2$, $BaTiO_3$, $Ba_2TiO_4$, ZnO, or a combination thereof. In the composition, a content of the metal oxide may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt % based on a total weight (or solid content weight) of the composition. The metal oxide fine particles may be non-luminescent.

The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The (multiple) thiol compound may be a dithiol compound, a trithiol compound, a tetrathiol compound, or a combination thereof. For example, the thiol compound may be glycoldi-3-mercaptopropionate, glycoldimercaptoacetate, tri methylolpropanetris (3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

A content of the (multiple) thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt % based on a total weight (or total solid content weight) of the composition. The content of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt % based on a total weight (or total solid content weight) of the composition.

The composition may further include an organic solvent (or a liquid vehicle, hereinafter referred to as a solvent). Types of the usable solvent are not particularly limited. Non-limiting examples of the solvent or liquid vehicle may be ethyl 3-ethoxy propionate; an ethylene glycol series such as ethylene glycol, diethylene glycol, polyethylene glycol, and the like; a glycol ether series such as ethylene glycol monomethyl ether, ethylene glycol monoethyl ether, diethylene glycol monomethyl ether, ethylene glycol diethyl ether, diethylene glycol dimethyl ether, and the like; a glycol ether acetate series such as ethylene glycol acetate, ethylene glycol monoethyl ether acetate, diethylene glycol monoethyl ether acetate, diethylene glycol monobutyl ether acetate, and the like; a propylene glycol series such as propylene glycol, and the like; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, dipropylene glycol diethyl ether, and the like; a propylene glycol ether acetate series such as propylene glycol monomethyl ether acetate, dipropylene glycol monoethyl ether acetate, and the like; an amide series such as N-methylpyrrolidone, dimethyl formamide, dimethyl acetamide, and the like; dimethylsulfoxide; a ketone series such as methylethylketone (MEK), methylisobutylketone (MIBK), cyclohexanone, and the like; a petroleum product such as solvent naphtha, and the like; an ester series such as ethyl acetate, butyl acetate, or ethyl lactate; an ether such as tetrahydrofuran, diethyl ether, dipropyl ether, dibutyl ether, and the like, chloroform, a C1 to C40 aliphatic hydrocarbon group (e.g., alkane, alkene, or alkyne), a halogen- (e.g., chlorine-) substituted C1 to C40 aliphatic hydrocarbon group (e.g., dichloroethane, trichloromethane, etc.), a C6 to C40 aromatic hydrocarbon group (e.g., toluene, xylene, etc.), a halogen- (e.g., chlorine-) substituted C6 to C40 aromatic hydrocarbon group, or a combination thereof, but is not limited thereto.

The type and amount of the organic solvent are appropriately determined taking into consideration the types and amounts of the aforementioned main components (i.e., quantum dots, dispersing agents, polymerizable monomers, initiators, and if present thiol compounds), and other additives described herein. The composition includes the solvent in an amount other than the desired solid content (nonvolatile component) amount.

The composition (e.g., inkjet composition) may have a viscosity at 25° C. of greater than or equal to about 4 centipoise (cPs), greater than or equal to about 5 cPs, greater than or equal to about 5.5 cPs, greater than or equal to about 6.0 cPs, or greater than or equal to about 7.0 cPs. The composition may have a viscosity at 25° C. of less than or equal to about 12 cPs, less than or equal to about 10 cPs, or less than or equal to about 9 cPs.

When used in inkjet, the composition is discharged to the substrate at room temperature, and may form a quantum dot composite film or a pattern thereof, for example, by heating. The ink composition, while having the aforementioned viscosity, may have a surface tension at 23° C. of greater than or equal to about 21 millinewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, or less than or equal to about 32 mN/m. The ink composition may have a surface tension of less than or equal to about 31 mN/m, less than or equal to about 30 mN/m, less than or equal to about 29 mN/m, or less than or equal to about 28 mN/m.

The composition of an embodiment may further include, for example, an additive included in a composition for a photoresist or an ink composition. The additive may include a light diffusing agent, a leveling agent, a coupling agent, and the like. The contents of US-2017-0052444-A1 may be referred to for details thereof.

The composition according to an embodiment may be prepared by a method including: preparing quantum dot dispersion including the aforementioned quantum dots, dispersing agent, and solvent; and mixing the quantum dot dispersion with the initiator; the polymerizable monomers (e.g., acryl-based monomers); optionally the thiol compound; optionally the metal oxide particulate, and optionally the aforementioned additives. Each of the aforementioned components may be mixed sequentially or simultaneously, but mixing orders are not particularly limited.

The composition according to an embodiment may be used to provide a pattern of a quantum dot composite (e.g., a quantum dot polymer composite). The composition may provide the quantum dot composite by (e.g., radical) polymerization. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing).

The quantum dot composite (polymer composite) includes a (polymer) matrix; and the aforementioned quantum dot(s) dispersed in the matrix. The quantum dot composite may further include metal oxide particulates dispersed in the matrix. The (polymer) matrix may include a cross-linked polymer or a linear polymer. The cross-linked polymer may include a thiol-ene resin, cross-linked poly(meth)acrylate, cross-linked polyurethane, a cross-linked epoxy resin, a cross-linked vinyl polymer, a cross-linked silicone resin, or a combination thereof. The linear polymer may include a carboxylic acid-containing repeating unit.

The matrix may include the aforementioned dispersing agent (e.g., carboxylic acid group-containing binder monomer or polymer), a polymerization product (e.g., insulating polymer) of a polymerizable monomer having a carbon-carbon double bond (at least one, for example, at least two, at least three, at least four, or at least five), and a polymerization product of the polymerizable monomer and a thiol compound having a, e.g., at least one (e.g., two or more), thiol groups.

In an embodiment, the polymer matrix may include a cross-linked polymer, a linear polymer, or a combination thereof. The cross-linked polymer may include a thiol-ene resin, a cross-linked poly(meth)acrylate, or a combination thereof. In one embodiment, the cross-linked polymer may be a polymerization product of the aforementioned polymerizable monomer and optionally a thiol compound (e.g., a monothiol having one thiol group or a polythiol compound having at least two thiol groups, for example, at a terminal end thereof). Descriptions of the quantum dots, dispersing agent, polymerizable monomer, and polythiol compound are the same as described herein.

The (e.g., patternable) film of the quantum dot composite may have a thickness of less than or equal to about 30 micrometers (μm), for example, 25 μm, less than or equal to about 20 μm, less than or equal to about 15 μm, less than or equal to about 10 μm, less than or equal to about 8 μm, or less than or equal to about 7 μm and greater than about 2 μm, for example, greater than or equal to about 3 μm, greater than or equal to about 3.5 μm, or greater than or equal to about 4 μm.

In an embodiment, the patterned film of the quantum dot composite may include one or more repeating sections including a first section configured to emit predetermined light. In an embodiment, the repeating section may include a first section configured to emit the first light. The repeating section may include a second section configured to emit second light having a different maximum peak wavelength different from the first light. The first section, the second section, or each of the first section and the second section may include the aforementioned quantum dot composite. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section configured to emit or pass third light (e.g., blue light) different from the first light and the second light. The third light may include excitation light. The third light may have a maximum peak wavelength of greater than or equal to about 380 nm and less than or equal to about 480 nm.

Figure 2A:
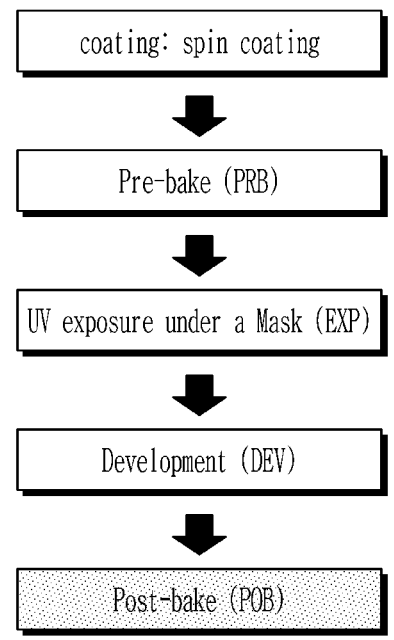
FIG. 2A is a schematic view showing a pattern forming process using the composition of an embodiment.

The patterned quantum dot composite film may be produced by using a photoresist composition. The method may include forming a film of the aforementioned composition on a substrate (S1); exposing a selected region of the film to light (e.g., a wavelength of less than or equal to about 400 nm) (S2); and developing the exposed film with an alkali developing solution to obtain a pattern of the quantum dot-polymer composite (S3). Referring to FIG. 2A, the aforementioned composition is coated to have a predetermined thickness on a substrate in an appropriate method of spin coating, slit coating, and the like. The formed film may be, optionally, pre-baked (PRB). The pre-baking may be performed by selecting appropriate conditions such as temperature, time, an atmosphere, and the like.

The formed (or optionally pre-baked) film is exposed to light having a predetermined wavelength under a mask having a predetermined pattern (EXP). A wavelength and intensity of the light may be selected taking into consideration types and amounts of the photoinitiator, types and amounts of the quantum dots, and the like.

The exposed film is treated with an alkali developing solution (e.g., dipping or spraying) to dissolve an unexposed region and obtain a desired pattern (DEV). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes).

When the quantum dot composite pattern has a plurality of repeating sections, between which may be disposed a black matrix (BM), a quantum dot composite having a desired pattern may be obtained by preparing a plurality of compositions including a quantum dot having desired luminescence properties (a photoluminescence peak wavelength and the like) to form each repeating section (e.g., a red (R) light emitting quantum dot, a green (G) light emitting quantum dot, or optionally, a blue (B) light emitting quantum dot) and repeating the aforementioned pattern formation process for each composition an appropriate number of times (e.g., twice or more or three times or more). For example, the quantum dot composite may have a pattern of at least two repetitive color sections (e.g., RGB sections). Such a quantum dot composite pattern may be used as a photoluminescent type color filter in a display device.

Figure 2A:
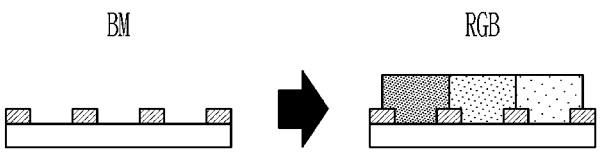
Figure 2B:
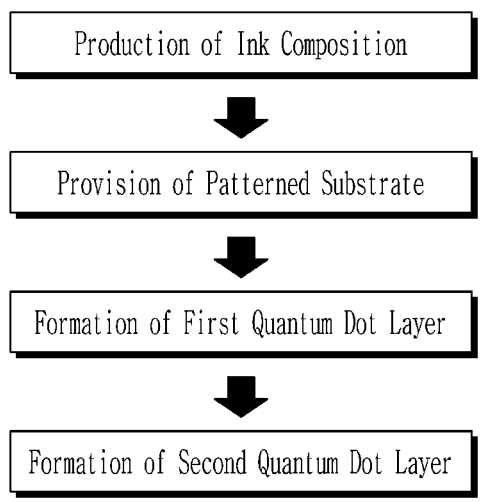
FIG. 2B is a schematic view showing a pattern forming process using an ink composition of an embodiment.

The quantum dot composite pattern may be produced using an ink composition configured to form a pattern in an inkjet method. Referring to FIG. 2B, the method may include providing an ink composition, providing a substrate (e.g., in which pixel area is patterned by an electrode and optionally, a bank, etc.); depositing the ink composition on the substrate (or the pixel area) to provide, for example, a first quantum dot layer (or first repeating section); and depositing an ink composition on the substrate (or the pixel area) to provide, for example, a second quantum dot layer (or second repeating section). The forming a first quantum dot layer and the forming a second quantum dot layer are simultaneously or sequentially carried out.

The depositing an ink composition may be performed using an appropriate liquid crystal discharger such as an Inkjet or nozzle printing system (e.g., having an ink storage and a, e.g., at least one, print head). The deposited ink composition may provide a (first or second) quantum dot layer through the solvent removal and polymerization by the heating. The method may provide a highly precise quantum dot composite film or pattern for a short time by the simple method.

The aforementioned quantum dot or quantum dot composite (pattern) may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dots may be included in an electronic apparatus. Such an electronic apparatus may include a portable terminal device, a monitor, a notebook personal computer (PC), a television, an electronic display, a camera, an automobile, and the like, but are not limited thereto. The electronic apparatus may be a portable terminal device including a display device (or light emitting device) including quantum dots, a monitor, a notebook PC, or a television. The electronic apparatus may be a camera or a portable terminal device including an image sensor including quantum dots. The electronic apparatus may be a camera or a vehicle including a photodetector including quantum dots.

The device (display device or light emitting device) may further include a luminescent element, e.g., light emitting element, and optionally a light source. The luminescent element may include a light emitting layer. The luminescent element may further include a substrate, and the light emitting layer may be disposed on one surface of the substrate. The light emitting layer may include a film or patterned film of the quantum dot composite. The light source may be configured to provide incident light to the luminescent element. The incident light may have a photoluminescence peak wavelength in a range of greater than or equal to about 440 nm, for example, greater than or equal to about 450 nm and less than or equal to about 500 nm, for example, less than or equal to about 480 nm, less than or equal to about 470 nm, or less than or equal to about 460 nm.

Figure 3:
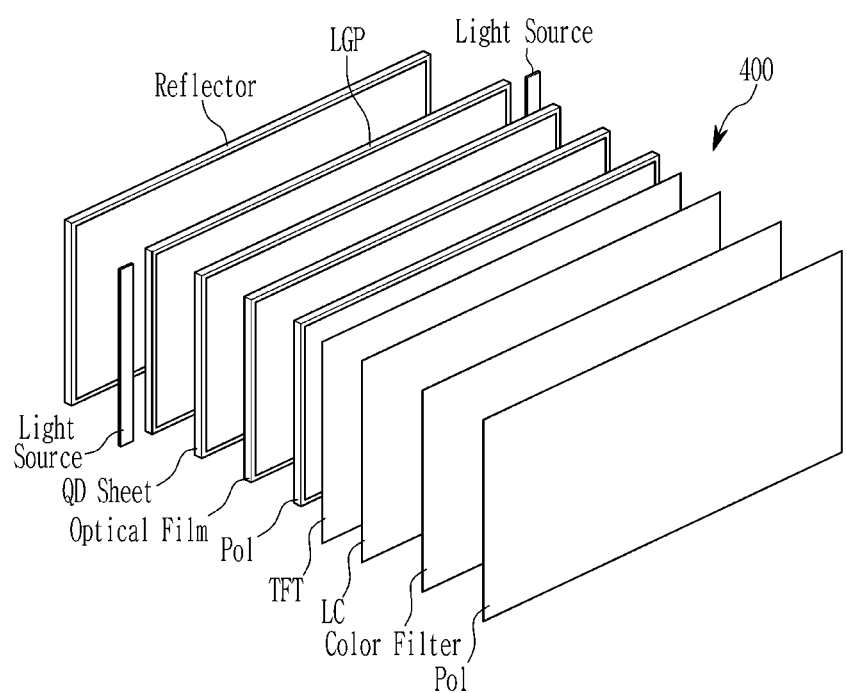
FIG. 3 is an exploded view of a display device according to an embodiment.

In an embodiment, the luminescent element or the light emitting layer may include a sheet of the quantum dot composite. Referring to FIG. 3, a photoluminescence type device 400 includes a backlight unit and a liquid crystal panel, and the backlight unit may include a quantum dot polymer composite sheet (QD sheet). Specifically, the backlight unit may include a reflector, a light guide plate (LGP), a light source (blue LED, etc.), a quantum dot polymer composite sheet (QD sheet), and optical films (prism, dual brightness enhancement film (DBEF), etc.) and the like). The liquid crystal panel is disposed on the backlight unit and may have a structure including a thin film transistor (TFT), liquid crystal (LC), and a color filter between two polarizers (Pol). The quantum dot polymer composite sheet (QD sheet) may include quantum dots emitting red light and quantum dots emitting green light by absorbing light from a light source. Blue light from the light source may be combined with red light and green light emitted from quantum dots and converted to white light by passing through the quantum dot polymer composite sheet. The white light may be separated to blue light, green light, and red light by a color filter in the liquid crystal panel and may be emitted to the outside in each pixel.

The light emitting layer may be disposed on a front surface (e.g., a light extraction surface) of a device (light emitting device or display device) in a form of a quantum dot (or a composite thereof) patterned film. The patterned film includes repeating sections configured to emit desired light. The repeating section may include a first section. The first section may be a red light emitting section. The repeating section may include a second section. The second section may include a green light emitting section. The repeating section may include a third section. The third section may be a section that emits or transmits blue light. Details of the first, second, and third sections are as described herein.

The light source may be an element that emits excitation light. The excitation light may include blue light and, optionally, green light. The light source may include an LED. The light source may include an organic LED (OLED). On the front surface (light emitting surface) of the first section and the second section, an optical element to block (e.g., reflect or absorb) blue light (and optionally green light) for example, a blue light (and optionally green light) blocking layer or a first optical filter that will be described herein may be disposed. When the light source includes organic light emitting diode to emit blue light and an organic light emitting diode to emit green light, a green light removing filter may be further disposed on a third section through which blue light is transmitted.

The light source may include a plurality of light emitting units respectively corresponding to the first section and the second section, and the light emitting units may include a first electrode and a second electrode facing each other and an (organic) electroluminescent layer between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Figure 4A:
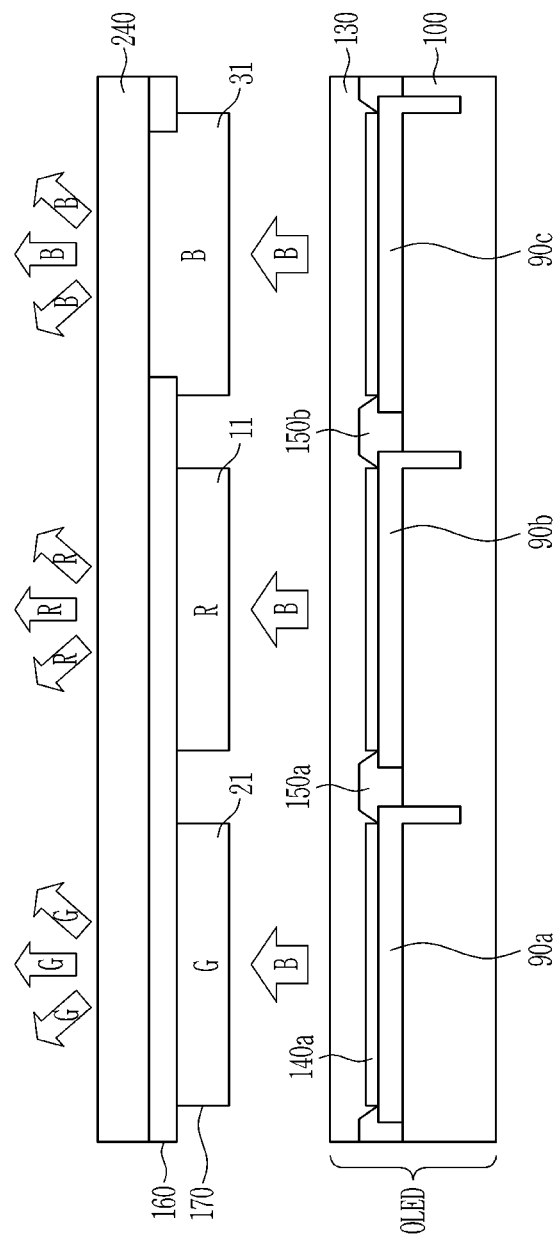
FIG. 4A is a schematic sectional view of a display device according to an embodiment.
Figure 4B:
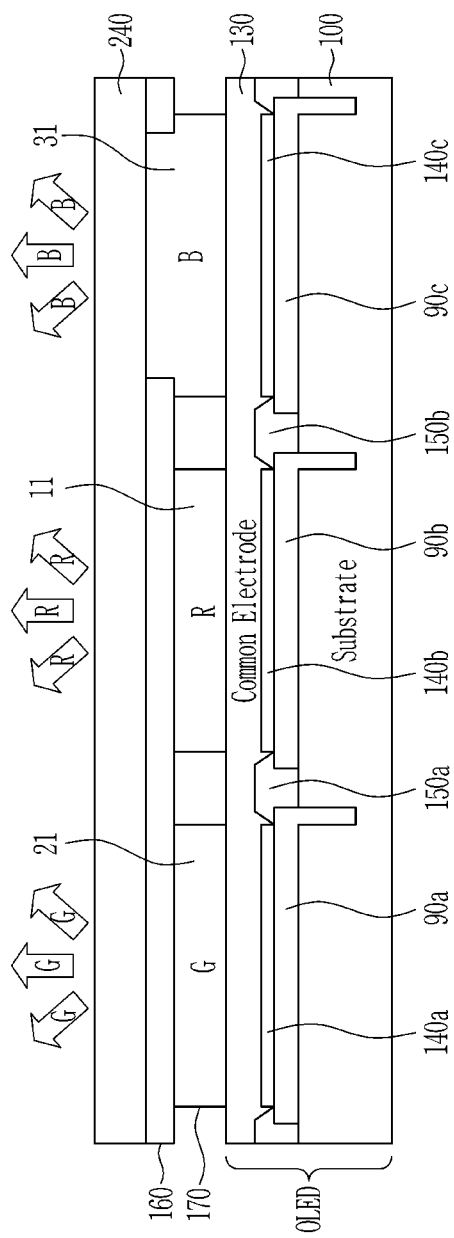
FIG. 4B is a schematic sectional view of a display device according to an embodiment.

FIG. 4A is a schematic cross-sectional view of a display device according to an embodiment and FIG. 4B is a schematic cross-sectional view of a display device according to an embodiment. Referring to FIGS. 4A and 4B, the light source includes an organic light emitting diode (OLED) that emits blue (B) light (and optionally green light). The organic light emitting diode (OLED) may include at least two pixel electrodes 90a, 90b, 90c formed on the substrate 100, a pixel define layer 150a, 150b formed between the adjacent pixel electrodes 90a, 90b, 90c, an organic light emitting layer 140a, 140b, 140c formed on each pixel electrode 90a, 90b, 90c, and a common electrode layer 130 formed on the organic light emitting layer 140a, 140b, 140c. A thin film transistor and a substrate may be disposed under the organic light emitting diode (OLED). A laminated structure including the quantum dot composite pattern 170 (e.g., a first section 11 or R including red light emitting quantum dots, a second section 21 or G including green light emitting quantum dots, and a third section 31 or B including or not including a quantum dot, e.g., a blue light emitting quantum dot) pattern and substrate 240 may be disposed on the light source. The blue light emitted from the light source enters the first section and second section and may emit red light and green light, respectively. The blue light emitted from the light source may pass through the third section. An element (first optical filter 160 or excitation light blocking layer) configured to block the excitation light may be disposed between the quantum dot composite layers R and G and the substrate, as desired. When the excitation light includes blue light and green light, a green light blocking filter may be added to the third section. The first optical filter or the excitation light blocking layer will be described in more detail herein.

Such a (display) device may be produced by separately producing the aforementioned laminated structure and LED or OLED (e.g., emitting blue light) and then combining them. The (display) device may be produced by directly forming the quantum dot composite pattern on the LED or OLED.

The substrate may be a substrate including an insulation material. The substrate may include glass; various polymers such as a polyester of polyethylene terephthalate (PET), polyethylene naphthalate (PEN), and the like, polycarbonate, and polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may vary depending on an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are laminated sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode not covered by the pixel define layer may provide an opening. An organic light emitting layer that will be described herein may be formed in the region defined by the opening.

The organic light emitting layer defines each pixel area by the aforementioned pixel electrode and the pixel define layer. In other words, one pixel area may be defined as an area formed with one organic light emitting unit layer which is contacted with one pixel electrode divided by the pixel define layer. In the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belonging to a visible light region or belonging to an ultraviolet (UV) region. Each of the first to the third pixel areas of the organic light emitting layer may emit third light. In an embodiment, the third light may be a light having the highest energy in the visible light region, for example, may be blue light (and optionally green light). When all pixel areas of the organic light emitting layer are designed to emit the same light, each pixel area of the organic light emitting layer may be all formed of the same or similar materials or may show, e.g., exhibit, the same or similar properties. Thus a process of forming the organic light emitting layer may be simplified, and the display device may be easily applied for, e.g., made by, a large scale/large area process. However, the organic light emitting layer according to an embodiment is not necessarily limited thereto, but the organic light emitting layer may be designed to emit at least two different lights, e.g., at least two different colored lights.

The organic light emitting layer includes an organic light emitting unit layer in each pixel area, and each organic light emitting unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the laminated structure and the lower substrate, and in the laminated structure, the photoluminescence layer (i.e., light emitting layer) may be disposed to face the liquid crystal layer. The display device may further include a polarizing plate between the liquid crystal layer and the light emitting layer. The light source may further include LED and if desired, a light guide plate.

Figure 5:
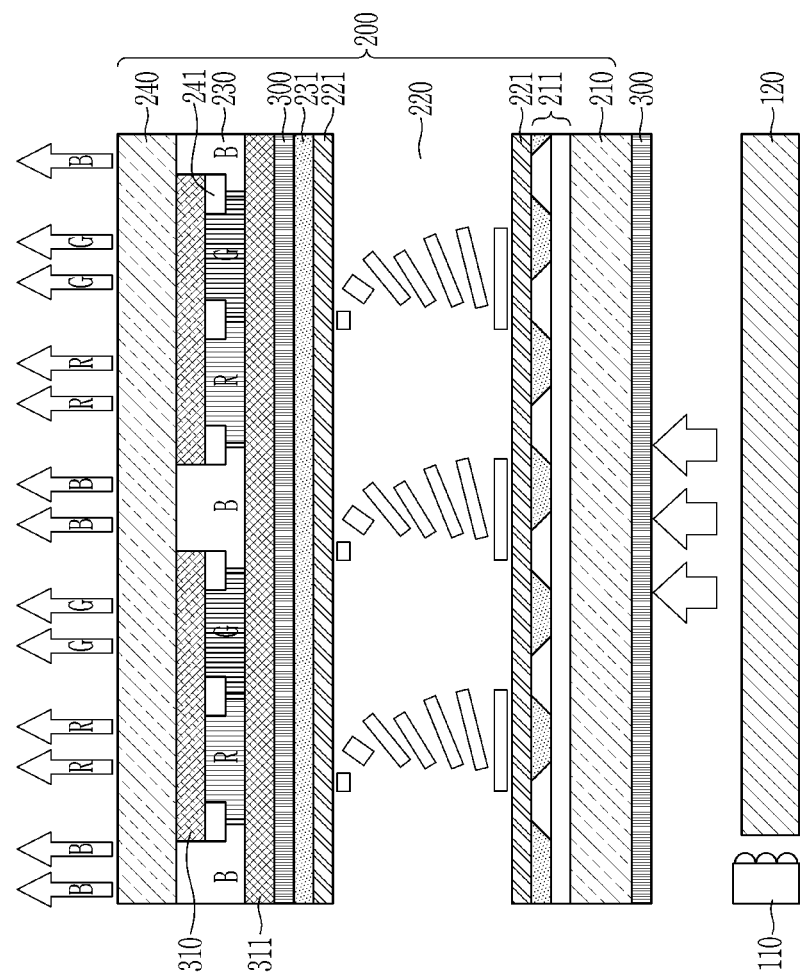
FIG. 5 is a schematic cross-sectional view of a display device according to an embodiment.

Non-limiting examples of the display device (e.g., a liquid crystal display device) according to an embodiment are illustrated with a reference to a drawing. FIG. 5 is a schematic cross sectional view showing a liquid crystal display according to an embodiment. Referring to FIG. 5, the display device of an embodiment includes a liquid crystal panel 200, a polarizing plate 300 disposed under the liquid crystal panel 200, and a backlight unit disposed under the polarizing plate 300.

The liquid crystal panel 200 includes a lower substrate 210, a stack structure, and a liquid crystal layer 220 disposed between the stack structure and the lower substrate. The stack structure includes a transparent substrate 240, a first optical filter layer 310, a photoluminescent layer 230 including a pattern of a quantum dot polymer composite, and a second optical filter layer 311.

The lower substrate 210 referred to as an array substrate may be a transparent insulation material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

Details of such a wire plate are not particularly limited. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizing plate 300 is provided under the lower substrate 210. Materials and structures of the polarizing plate 300 are not particularly limited. A backlight unit (e.g., emitting blue light) may be disposed under the polarizing plate 300. An upper optical element or the polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any suitable polarizer that used in a liquid crystal display device. The polarizing plate may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source 110 may emit blue light or white light. The light source 110 may include a blue LED, a white LED, a white OLED, or a combination thereof, but is not limited thereto.

The backlight unit may further include a light guide plate 120. In an embodiment, the backlight unit may be an edge-type lighting. For example, the backlight unit may include a reflector (not shown), a light guide plate (not shown) provided on the reflector and providing a planar light source with the liquid crystal panel 200, a, e.g., at least one, optical sheet (not shown) on the light guide plate, for example, a diffusion plate, a prism sheet, and the like, or a combination thereof, but is not limited thereto. The backlight unit may not include a light guide plate. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, a light guide plate, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot composite pattern including a first section (R) configured to emit first light (e.g., red light), a second section (G) configured to emit second light (e.g., green light), and a third section (B) configured to emit/transmit, for example blue light. If desired, the photoluminescent layer 230 may further include a, e.g., at least one, fourth section. The fourth section may include a quantum dot that emits a light of different color from light emitted from the first to third sections (e.g., cyan, magenta, and yellow light).

In the photoluminescent layer 230, sections forming the pattern may be repeated corresponding to pixel areas formed on the lower substrate 210. A transparent common electrode 231 may be provided on the photoluminescent type color filter layer.

The third section (B) configured to emit/transmit blue light may be a transparent color filter that does not change an emission spectrum of the light source. In this case, blue light emitted from the backlight unit may enter in a polarized state and may be emitted through the polarizing plate and the liquid crystal layer as is. If desired, the third section may include a quantum dot emitting blue light.

As described herein, if desired, the display device or light emitting device of an embodiment may further have an excitation light blocking layer or a first optical filter layer (hereinafter referred to as a first optical filter layer). The first optical filter layer may be disposed between the bottom surface of the first section (R) and the second section (G) and the substrate (e.g., the upper substrate 240) or on the upper surface of the substrate. The first optical filter layer 310 may be a sheet having an opening in a region corresponding to a pixel area (a third section) displaying blue and thus formed in a region corresponding first and second sections. That is to say, the first optical filter layer may be disposed at the positions except the position overlapped with the third section and integrally therewith as shown in FIGS. 2A, 2B, and FIG. 3, but is not limited thereto. For example, at least two first optical filter layers may be disposed leaving a space at each position overlapped with the first and second sections. When the light source includes a green light emitting element, a green light blocking layer may be disposed on the third section.

The first optical filter layer may block (e.g., absorb) or substantially block light having, for example, a predetermined wavelength region in the visible light region and may transmit light in the other wavelength regions, and for example, the first optical filter layer may block blue light (or green light) and may transmit light except the blue light (or green light). The first optical filter layer may transmit, for example, green light, red light, and/or yellow light which is a mixed color thereof.

The first optical filter layer may substantially block excitation light and transmit light in a desired wavelength range. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit red light may be disposed at a position overlapped with the red light emission section, and the first optical filter layer configured to selectively transmit green light may be disposed at a position overlapped with the green light emission section. The first optical filter layer may include a first region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or a combination thereof. When the light source emits blue and green mixed light, the first optical filter may further include a third region that selectively transmits blue light and blocks green light.

The first region may be disposed at a position overlapped with the green light emitting section. The second region may be disposed at a position overlapped with the red light emitting section. The third region may be disposed at a position overlapped with the blue light emitting section.

The first region, the second region, and, optionally, the third region may be optically isolated. Such a first optical filter layer may contribute to improvement of color purity of the display device.

The display device may further include a second optical filter layer (e.g., a red/green or yellow light recycle layer) 311 disposed between the photoluminescent layer and the liquid crystal layer (e.g., the photoluminescent layer and the upper polarizing plate, e.g., polarizer), transmitting at least a portion of third light (excitation light), and reflecting a, e.g., at least one, part of the first light, part of the second light, or part of each of the first light and second light. The first light may be red light, the second light may be green light, and the third light may be blue light. For example, the second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second sections and to be emitted to the outside of the display device.

The second optical filter layer or the first optical filter layer may be formed as an integrated layer having a relatively planar surface.

The first optical filter layer may include a polymer thin film including a dye absorbing light in a wavelength which is to be blocked, a pigment absorbing light in a wavelength which is to be blocked, or a combination thereof. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. The first optical filter layer or the second optical filter layer may be formed by laminating two layers having different refractive indexes refractive index. For example, the first/second optical filter layer may be formed by alternately laminating a material having a high refractive index and a material having a low refractive index.

Figure 6A:
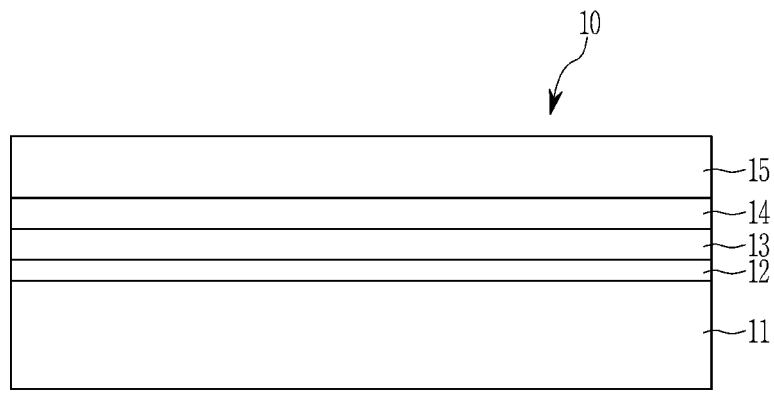
FIG. 6A is a schematic cross-sectional view of a light emitting device according to an embodiment.

Referring to FIG. 6A, the electronic device 10 includes a first electrode 11 and a second electrode 15 facing each other, an active layer 13 disposed between the first electrode 11 and the second electrode 15, and including the aforementioned quantum dots.

In an embodiment, the electronic device including the quantum dots may be an electroluminescent device. The quantum dots of the active layer 13 may be a light emitting layer in which electrons and holes injected from the first electrode 11 and the second electrode 15 are recombined to form excitons, and light of a constant wavelength by the energy of the formed excitons may be emitted. Also, the electronic device including the quantum dots may be a photodetector or a solar cell. Specifically, the active layer 13 may be a light absorbing layer in which the quantum dots absorb external photons and separates them into electrons and holes to provide electrons and holes to the first electrode 11 and the second electrode 15.

A hole auxiliary layer 12 may be disposed between the first electrode 11 and the active layer 13, and an electron auxiliary layer 14 may be disposed between the second electrode 15 and the active layer 13.

The electronic device 10 may further include a substrate (not shown). The substrate may be disposed at the side of the first electrode 11 or the second electrode 15. The substrate may be a substrate including an insulation material (e.g., an insulating transparent substrate). In addition, the substrate may include glass, various polymers such as polyester (e.g., polyethylene terephthalate (PET), polyethylene naphthalate (PEN)), polycarbonate, polyacrylate, polyimide, polyamide-imide, and the like, inorganic materials such as polysiloxane (e.g., PDMS), $Al_2O_3$, ZnO, and the like, or a combination thereof, and may be made of a silicon wafer. Herein, "transparent" refers to may mean that transmittance through which light of a certain wavelength (e.g., light emitted from the quantum dots) passes is greater than or equal to about 85%, greater than or equal to about 88%, greater than or equal to about 90%, greater than or equal to about 95%, greater than or equal to about 97%, or greater than or equal to about 99%. A thickness of the substrate may be appropriately selected taking into consideration a substrate material, and the like, but is not particularly limited. The transparent substrate may have flexibility.

One of the first electrode 11 and the second electrode 15 may be an anode and the other may be a cathode. For example, the first electrode 11 may be an anode and the second electrode 15 may be a cathode.

The first electrode 11 may be made of a conductor, for example, a metal, a conductive metal oxide, or a combination thereof. The first electrode 11 may be, for example, made of a metal such as nickel, platinum, vanadium, chromium, copper, zinc, and gold or an alloy thereof, a conductive metal oxide such as zinc oxide, indium oxide, tin oxide, indium tin oxide (ITO), indium zinc oxide (IZO), or fluorine doped tin oxide, or, or a combination of a metal and an oxide such as ZnO and Al or $SnO_2$ and Sb, but is not limited thereto. The second electrode 15 may be made of a conductor, for example a metal, a conductive metal oxide, a conductive polymer, or a combination thereof. The second electrode 15 may be for example made of a metal such as aluminum, magnesium, calcium, sodium, potassium, titanium, indium, yttrium, lithium, gadolinium silver, gold, platinum, tin, lead, cesium, and barium or an alloy thereof, a multi-layered structure material such as LiF/Al, lithium oxide ($Li_2O$)/Al, 8-hydroxyquinolinato lithium (Liq)/Al, LiF/Ca, and $BaF_2$/Ca, but is not limited thereto. The conductive metal oxide is the same as described herein.

The work function of the first electrode 11 and the second electrode is not particularly limited, and may be appropriately selected. The work function of the first electrode 11 may be higher or lower than the work function of the second electrode 15.

The first electrode 11, the second electrode 15, or a combination thereof may be a light-transmitting electrode, and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

The thickness of the first electrode, second electrode, or each of the first and second electrodes is not particularly limited, and may be appropriately selected taking into consideration device efficiency. For example, the thickness of the electrodes may be greater than or equal to about 5 nm, for example, greater than or equal to about 50 nm and less than or equal to about 100 µm, for example, less than or equal to about 10 µm, less than or equal to about 1 µm, less than or equal to about 900 nm, less than or equal to about 500 nm, or less than or equal to about 100 nm.

The active layer 13 includes the quantum dots described herein. The active layer 13 may include quantum dot layers of a monolayer or a plurality of monolayers. The plurality of monolayer layers may be two layers or more, three layers or more, or four layers or more and 20 layers or less, 10 layers or less, 9 layers or less, 8 layers or less, 7 layers or less, or 6 layers or less. The active layer 13 may have a thickness of greater than or equal to about 5 nm, for example, greater than or equal to about 10 nm, greater than or equal to about 20 nm, or greater than or equal to about 30 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 13 may have a thickness of about 10 nm to about 150 nm about 10 nm to about 100 nm, or about 10 nm to about 50 nm.

The electronic device 10 may further include a hole auxiliary layer 12. The hole auxiliary layer 12 is disposed between the first electrode 11 and the active layer 13. The hole auxiliary layer 12 may include a hole injection layer (HIL), a hole transport layer (HTL), an electron blocking layer (EBL), or a combination thereof. The hole auxiliary layer 12 may be a single-component layer or a multilayer structure in which adjacent layers include different components.

The highest occupied molecular orbital (HOMO) energy level of the hole auxiliary layer 12 may have a HOMO energy level that may be matched with the HOMO energy level of the active layer 13 in order to enhance mobility of holes transferred from the hole auxiliary layer 12 to the active layer 13. For example, the hole auxiliary layer 12 may include a hole injection layer close to the first electrode 11 and a hole transport layer close to the active layer 13.

Materials included in the hole auxiliary layer 12 (e.g., a hole transport layer or a hole injection layer) are not particularly limited, but may for example include poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino] biphenyl (α-NPD), 4,4',4"-tris[phenyl(m-tolyl)amino] triphenylamine (m-MTDATA), 4,4',4"-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbon-based material such as graphene oxide, or a combination thereof, but are not limited thereto.

When the electron blocking layer (EBL) is used, the electron blocking layer (EBL) may include, for example, poly(3,4-ethylenedioxythiophene):poly(styrenesulfonate (PEDOT:PSS), poly(9,9-dioctyl-fluorene-co-N-(4-butylphenyl)-diphenylamine) (TFB) polyarylamine, poly (N-vinylcarbazole, polyaniline, polypyrrole, N, N, N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 50 nm, for example, less than or equal to about 40 nm, less than or equal to about 35 nm, or less than or equal to about 30 nm, but is not limited thereto.

The electronic auxiliary layer 14 may be disposed between the active layer 13 and the second electrode 15. The electron auxiliary layer 14 may include, for example, an electron injection layer (EIL) that facilitates injection of electrons, an electron transport layer (ETL) that facilitates electron transport, a hole blocking layer (HBL) that blocks hole movement, or a combination thereof. For example, an electron injection layer may be disposed between the electron transport layer and the cathode. For example, the hole blocking layer (HBL) may be disposed between the active layer and the electron transport (injection) layer, but is not limited thereto. For example, the thickness of each layer may be greater than or equal to about 1 nm and less than or equal to about 500 nm, but is not limited thereto. The electron injection layer may be an organic layer formed by vapor deposition and the electron transport layer may include inorganic oxide nanoparticles.

The electron transport layer (ETL) may include, for example 1,4,5,8-naphthalene-tetracarboxylic dianhydride (NTCDA), bathocuproine (BCP), tris[3-(3-pyridyl)-mesityl]borane (3TPYMB), Li F, tris(8-hydroxyquinolinato) aluminum ($Alq_3$), tris(8-hydroxyquinolinato) gallium ($Gaq_3$), tris(8-hydroxyquinolinato) indium ($Inq_3$), bis(8-hydroxyquinolinato) zinc ($Znq_2$), bis(2-(2-hydroxyphenyl) benzothiazolate) zinc ($Zn(BTZ)_2$), bis(10-hydroxybenzo[h]quinolinato) beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an N-type metal oxide (e.g., ZnO, $HfO_2$, etc.), or a combination thereof, but is not limited thereto.

In addition, the electron transport layer (ETL) may include a plurality of nanoparticles. The nanoparticles may include metal oxides including zinc, for example, zinc oxide, zinc magnesium oxide, or a combination thereof. The metal oxide may include $Zn_{1-x}M_xO$ (wherein, M is Mg, Ca, Zr, W, Li, Ti, Y, Al, or a combination thereof and $0 \leq x \leq 0.5$). In the chemical formula, x may be greater than or equal to about 0.01 and less than or equal to about 0.3, for example, 0.25, less than or equal to about 0.2, or less than or equal to about 0.15. An absolute value of lowest unoccupied molecular orbital (LUMO) of the aforementioned quantum dots included in the active layer may be smaller than an absolute value of LUMO of the metal oxide. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, Gaq3, Inq3, Znq2, $Zn(BTZ)_2$, $BeBq_2$, or a combination thereof, but is not limited thereto.

each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 6B:
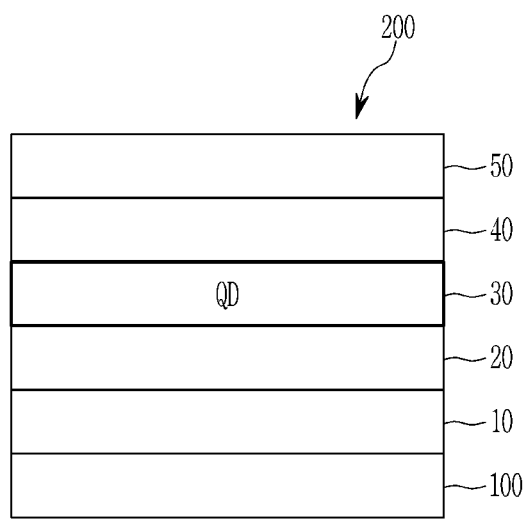
FIG. 6B is a schematic cross-sectional view of a light emitting device according to an embodiment.

Referring to FIG. 6B, a device according to an embodiment may have a normal structure. An electroluminescent device 200 may include an anode 10 disposed on the transparent substrate 100 and a cathode 50 facing the anode 10. The anode 10 may include a metal oxide-based transparent electrode, and the cathode 50 facing the anode 10 may include a conductive metal having a low work function. For example, the anode may include an indium tin oxide (ITO, work function of about 4.6 to about 5.1) electrode, and the cathode 50 may include an electrode including magnesium (Mg, work function of about 3.66), aluminum (Al, work function of about 4.28), or a combination thereof. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10 and the hole transport layer may be disposed close to the quantum dot active layer. Also, the electron auxiliary layer 40 may be disposed between the quantum dot active layer 30 and the cathode 50. The electron auxiliary layer 40 may include an electron injection layer, an electron transport layer, or a combination thereof. The electron injection layer may be disposed close to the cathode 50 and the electron transport layer may be disposed close to the quantum dot active layer 30.

Figure 6C:
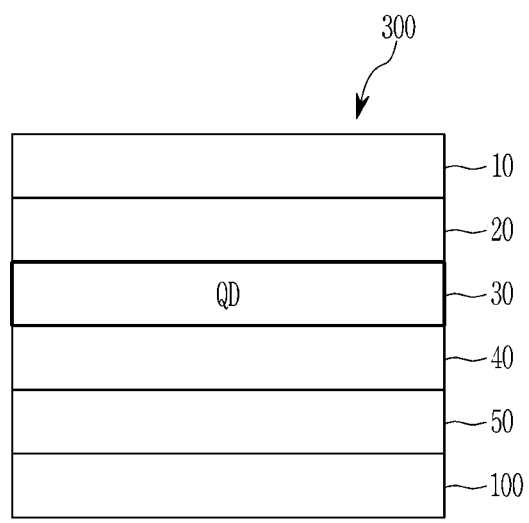
FIG. 6C is a schematic cross-sectional view of a light emitting device according to an embodiment.

Referring to FIG. 6C, a device according to an embodiment may have an inverted structure. The inverted electroluminescent device 300 may include a cathode 50 disposed on the transparent substrate 100 and an anode 10 facing the cathode 50. The cathode 50 may include a metal oxide-based transparent electrode, and the anode 10 facing the cathode 50 may include a conductive metal having a high work function. For example, the anode 50 may be an indium tin oxide (ITO, work function of about 4.6 to 5.1) electrode, the cathode 10 may be an electrode including gold (Au, work function of about 5.1), silver (Ag, work function of about 4.26), aluminum (Al, work function of 4.28), or a combination thereof. Also, the electronic auxiliary layer 40 may be disposed between the quantum dot active layer 30 and the cathode 50. The electron auxiliary layer 40 may include an electron injection layer, an electron transport layer, or a combination thereof. The electron injection layer may be disposed close to the cathode 50 and the electron transport layer may be disposed close to the quantum dot active layer 30. The electron auxiliary layer 40 may include, for example, a metal oxide in the electron transport layer, and a crystalline Zn oxide or an n-type doped metal oxide. Also, a hole auxiliary layer 20 may be disposed between the anode 10 and the quantum dot active layer 30. The hole auxiliary layer 20 may include a hole injection layer, a hole transport layer, or a combination thereof. The hole injection layer may be disposed close to the anode 10, and the hole transport layer may be disposed close to the quantum dot active layer 30. The hole transport layer may include TFB, PVK, or a combination thereof, and the hole injection layer may include $MoO_3$ or other p-type metal oxides.

In the electroluminescent device, light of a certain wavelength generated in the active layer 30 is emitted to the outside through the light-transmitting electrode and the transparent substrate. For example, referring to FIG. 2, when a metal oxide-based transparent electrode (e.g., indium tin oxide (ITO)), which is a light-transmitting electrode, is applied to the anode 10, the light formed in the active layer emitted to the outside through the anode 10 and the transparent substrate (100). Referring to FIG. 3, when a metal oxide-based transparent electrode (e.g., indium tin oxide (ITO)), which is a light-transmitting electrode, is applied to the cathode 50, light formed in the active layer is emitted to the outside through the cathode 50 and the transparent substrate 100.

The aforementioned electronic device may be produced by a suitable method. For example, the electroluminescent device may be produced by forming a hole auxiliary layer (or an electron auxiliary layer) on a substrate on which an electrode is formed, forming an active layer including quantum dots (e.g., a pattern of the aforementioned quantum dots), and forming an electron auxiliary layer (or a hole auxiliary layer) and an electrode. The electrode, the hole auxiliary layer, and the electron auxiliary layer may each be independently formed by a suitable method, and may be formed, for example, by vapor deposition or coating, but are not particularly limited.

An embodiment provides an electronic device including the aforementioned quantum dots. The electronic device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary examples of the present disclosure, and the present disclosure is not limited thereto.

EXAMPLES

Analysis Methods
1. Ultraviolet-visible (UV-Vis) Absorption Spectroscopy
UV-Vis absorption spectroscopy is performed using an Agilent Cary5000 spectrometer to obtain the UV-Visible absorption spectrum and its first derivative.
2. Photoluminescence Analysis
A photoluminescence (PL) spectrum of a produced quantum dot at a wavelength of 450 nanometers (nm) is obtained using a Hitachi F-7000 spectrophotometer.
3. Inductively Coupled Plasma (ICP) Analysis
Inductively coupled plasma atomic emission spectroscopy (ICP-AES) is performed by using Shimadzu ICPS-8100.
4. Blue Light Absorption Ratio and Light Conversion Ratio or Efficiency (CE) for Composites
Using the integrating hemisphere of the absolute quantum efficiency measuring equipment (QE-2100, Otsuka), a light quantity (B) of blue excitation light having a predetermined wavelength is measured. Subsequently, the QD polymer composite is placed in an integrating hemisphere, and blue excitation light is irradiated thereto and a light quantity (A) of green light emitted from the composite and a light quantity (B') of blue light passed through the composite are measured, respectively.

From the measured values, a blue light absorption ratio, a light conversion (e.g., photoconversion) ratio, and a light conversion efficiency (CE %) are obtained by the following equation.

Blue light absorption ratio (%)=(($B$−$B'$)/$B$)×100(%)

Light conversion ratio (%)=$A$/$B$

Light conversion efficiency ($CE$, %)=($A$/($B$−$B'$))×100 (%)

Reference Example 1: Preparation of InZnP Core

Zinc acetate and oleic acid are dissolved into 1-octadecene in a 250 milliliter (mL) reaction flask and heated at 120° C. under vacuum and then cooled at a room temperature to provide a zinc oleate solution.

Indium acetate and fatty acid ligand are added into the reaction flask and heated at 120° C. under the vacuum. A mole ratio of zinc and oleic acid is 1:2, and a mole ratio of indium and lauryl acid is 1:3. After 1 hour, the atmosphere in the reactor is changed to nitrogen. While the temperature in the reaction flask is increased to 250° C., the zinc oleate solution and a mixed solution of tris(trimethylsilyl)phosphine (TMS$_3$P) and trioctylphosphine are injected into the reactor, and a sample is taken and measured for an absorption spectrum, and then the reaction is carried out until reaching the target wavelength. By finishing the reaction, it is quickly cooled to the room temperature. Acetone is added into the reaction solution to provide a precipitate, and the obtained precipitate is dispersed again into toluene.

From the results of performing the obtained InZnP core with the absorption spectrum analysis, the first absorption wavelength of the obtained core is about 434 nm.

Example 1

1. Quantum Dot Synthesis
(1) Selenium is dispersed in trioctylphosphine to prepare a Se/TOP stock solution, and sulfur is dispersed in trioctylphosphine to prepare a S/TOP stock solution An indium laurate solution is prepared as a dopant precursor in accordance with the same procedure as in Reference Example.

Zinc acetate and oleic acid are dissolved in trioctylamine in 2 liter (L) reaction flask and vacuumed at 120° C. for 10 minutes. After substituting the inside of the reaction flask with N$_2$, the toluene dispersion of the InZnP semiconductor nanocrystal core obtained from Reference Example 1 is added thereto, and then Se/TOP is injected into the reaction flask. After increasing the flask temperature to 280° C., a dopant precursor is injected to the reaction system before finishing the reaction while monitoring whether the desired shell thickness is provided, so as to provide a reaction solution including particles in which a first shell (ZnSe) is disposed on the core, and indium dopant is included adjacent to the shell surface.

The total reaction time for providing the first shell is about 80 minutes, and the using amount of the Se precursor is adjusted to provide the composition of the ICP data which will be described herein for 1 mole of indium included in the core. The using amount of the dopant precursor (indium) is 1 weight percent (wt %) based on the selenium precursor.

Subsequently, the S/TOP stock solution is injected into the reaction solution at the reaction temperature, and the reaction is performed to provide a reaction solution including particles in which a second shell including ZnS is disposed on the first shell.

The reaction time for providing the second shell is 60 minutes, and the using amount of the S precursor is adjusted to provide a composition of the ICP data for 1 mole of indium included in the core which will be described herein.

An excess amount of ethanol is added into the reactant including the obtained quantum dots and centrifuged. After the centrifuge, a supernatant is discharged, and a precipitate is dried and then dispersed in toluene to provide a quantum dot solution (hereinafter, QD solution).

(2) An ICP-AES of the obtained QD is analyzed, and the results are shown in Table 1. A UV-Vis spectroscopy and a photoluminescence of the obtained QD are analyzed, the results are shown in Table 2. The quantum yield of the obtained QDs is about 97%.

2. Production of Quantum Dot Polymer Composite and Pattern Thereof (1) Preparation of Quantum Dot-Binder Dispersion The obtained toluene solution of the quantum dots is mixed with a binder (a quaternary copolymer of methacrylic acid, benzyl methacrylate, hydroxyethylmethacrylate, and styrene, an acid value: 130 milligrams of potassium hydroxide per gram (mg KOH/g), a molecular weight: 8,000, a methacrylic acid:benzylmethacrylate:hydroxyethylmethacrylate:styrene (a mole ratio)=61.5%:12%:16.3%:10.2%) solution (polypropylene glycol monomethyl ether acetate having a concentration of 30 wt %) to prepare quantum dot-binder dispersion.

(2) Preparation of Photosensitive Composition

The quantum dot binder dispersion is mixed with hexaacrylate having the following structure as a photopolymerizable monomer, glycoldi-3-mercaptopropionate (hereinafter, 2T), an oxime ester compound as an initiator, and $TiO_2$ as a light diffusing agent and PGMEA to prepare a composition.

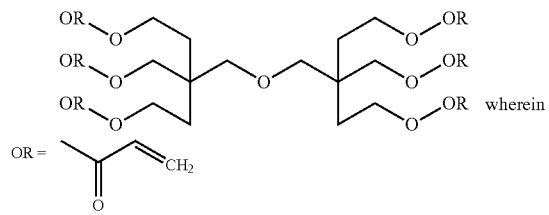

wherein

The composition includes 43 wt % of the quantum dot, 12.5 wt % of the binder polymer, 25 wt % of 2T, 12 wt % of the photopolymerizable monomer, 0.5 wt % of the initiator, and 10 wt % of the light diffusing agent based on a solid content of the composition, and a total solid content is 25 wt %.

(3) Production of Quantum Dot-Polymer Composite Pattern and Heat Treatment

Each photosensitive composition is spin-coated on a glass substrate at 150 rpm for 5 seconds to obtain films. The films are pre-baked (PRB) at 100° C. These pre-baked films are exposed to irradiation of light (a wavelength: 365 nm, intensity: 100 millijoules (mJ)) for 1 second under a mask having a predetermined pattern (e.g., a square dot or a stripe pattern), developed in a potassium hydroxide aqueous solution (a concentration: 0.043%) for 50 seconds to obtain quantum dot-polymer composite patterns (a thickness: 6 μm).

The obtained pattern is heat-treated (POB) at 180° C. for 30 minutes under a nitrogen atmosphere. The light conversion efficiency of the composite is about 34%.

The obtained film pattern is measured for a blue light absorption ratio of the single film, and the results are shown in Table 2.

Example 2

1. Core/shell quantum dots are obtained in accordance with the same procedure as in Example 1, except that the amount of the dopant precursor used for providing the first shell is changed to 5 wt % relative to the selenium precursor. ICP analysis for the obtained quantum dots is performed, and the results are shown in Table 1.

The ICP-AES analysis, the UV-Vis photospectrometry, and the photoluminescence analysis of the obtained QD are performed, and the results are shown in Table 2. The quantum yield of the obtained QDs is about 90%.

2. A quantum dot-polymer composite pattern is obtained in accordance with the same procedure as in Example 1, except that the prepared quantum dots are used. The obtained film pattern is measured for a blue light absorption ratio, and the results are shown in Table 2. The light conversion efficiency (CE, %) of the composite is about 32%.

Comparative Example 1

1. Core/shell quantum dots are obtained in accordance with the same procedure as in Example 1, except that the dopant precursor is not used during providing the first shell.

ICP analysis for the obtained quantum dots is performed, and the results are shown in Table 1.

The ICP-AES analysis, the UV-Vis spectroscopy, and the photoluminescence analysis of the obtained QD are performed, and the results are shown in Table 2.

2. A quantum dot-polymer composite pattern is obtained in accordance with the same procedure as in Example 1, except that the prepared quantum dots are used. The obtained film pattern is measured for a blue light absorption ratio, and the results are shown in Table 2.

TABLE 1

| | In:(S + Se) | S:Se | Zn:In | P:In |
|---|---|---|---|---|
| Example 1 | 0.04:1 | 0.65:1 | 29.78:1 | 0.67:1 |
| Example 2 | 0.06:1 | 0.611:1 | 18.93:1 | 0.48:1 |
| Comparative Example 1 | 0.027:1 | 0.5:1 | 43.36:1 | 0.98:1 |

TABLE 2

| | Solution | | Single film |
|---|---|---|---|
| | Maximum PL Intensity | FWHM | Absorption ratio |
| Comparative Example1 | 525 nm | 41 nm | 88% |
| Example1 | 527 nm | 38 nm | 88.5% |
| Example2 | 538 nm | 38 nm | 91.3% |

From the above results, it is confirmed that quantum dots of Examples 1 and 2 show high absorption ratio together with improved luminous efficiency when providing a single film.

Experimental Example 1

Quantum dots according to Example are performed with a ICP analysis in each step while the second semiconductor nanocrystal shell and the first semiconductor shell are etched using about 0.1 M of a diluted nitric acid solution, about 0.2 M of a diluted KOH solution, and about 1.0 M of a concentrated nitric acid solution.

As a result, it is confirmed that the second semiconductor nanocrystal shell is etched and removed by the diluted nitric acid solution, and the region (second layer) of the first semiconductor nanocrystal shell which is adjacent to the second semiconductor nanocrystal shell is etched by a diluted KOH solution, and indium is detected out together with sulfur, zinc, and selenium. (content of the detected indium per 1 mole of selenium: 0.018 mole)

Subsequently, when the first semiconductor nanocrystal shell is further etched by a concentrated nitric acid solution, it is confirmed to be a layer in which zinc and selenium are detected as a main components, and indium is not detected (i.e., third layer). When quantum dots are etched using the concentrated nitric acid solution, it is confirmed that the core is etched out together with the first semiconductor nanocrystal shell.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot, comprising
a semiconductor nanocrystal core comprising indium and phosphorus,
a first semiconductor nanocrystal shell disposed on the semiconductor nanocrystal core, the first semiconductor nanocrystal shell comprising zinc and selenium, and
a second semiconductor nanocrystal shell disposed on the first semiconductor nanocrystal shell, the second semiconductor nanocrystal shell comprising zinc and sulfur,
wherein the quantum dot does not comprise cadmium,
wherein the first semiconductor nanocrystal shell comprises a polyvalent metal dopant comprising indium at an interface with the second semiconductor nanocrystal shell, and
wherein in the quantum dot, a mole ratio of
zinc relative to indium is less than or equal to 30:1,
sulfur relative to selenium is less than or equal to 0.9:1, or
a combination thereof.

2. The quantum dot of claim 1, wherein the semiconductor nanocrystal core further comprises zinc.

3. The quantum dot of claim 1, wherein the second semiconductor nanocrystal shell has a thickness of less than about 0.7 nanometers.

4. The quantum dot of claim 1, wherein in the quantum dot, a mole ratio of sulfur relative to selenium is greater than or equal to about 0.1:1 and less than or equal to 0.9:1.

5. The quantum dot of claim 1, wherein in the quantum dot, a mole ratio of phosphorus relative to indium is less than or equal to about 0.75:1.

6. The quantum dot of claim 1, wherein the quantum dot has a mole ratio of phosphorus relative to indium of less than or equal to about 0.7:1.

7. The quantum dot of claim 1, wherein the quantum dot does not comprise copper, manganese, aluminum, magnesium, gallium, antimony, hafnium, zirconium, titanium, or a combination thereof.

8. The quantum dot of claim 1, wherein the polyvalent metal dopant has an atomic radius of greater than or equal to about 1.45 angstroms and less than or equal to about 2.18 angstroms.

9. The quantum dot of claim 1, wherein the quantum dot has a quantum efficiency of greater than or equal to about 89%.

10. The quantum dot of claim 1, wherein the quantum dot has a full width at half maximum of less than or equal to about 40 nanometers.

11. The quantum dot of claim 1, wherein a maximum luminescent peak of the quantum dots is present in a range of about 500 nanometers to about 560 nanometers or about 600 nanometers to about 650 nanometers.

12. A quantum dot composite, comprising
a matrix and
the quantum dots of claim 1 dispersed in the matrix.

13. A quantum dot comprising
a semiconductor nanocrystal core comprising a Group III-V compound,
a first semiconductor nanocrystal shell disposed on the semiconductor nanocrystal core, the first semiconductor nanocrystal shell comprising zinc and selenium, and
a second semiconductor nanocrystal shell disposed on the first semiconductor nanocrystal shell, the second semiconductor nanocrystal shell comprising zinc and sulfur,
wherein the quantum dot does not comprise cadmium,
wherein the first semiconductor nanocrystal shell comprises a polyvalent metal dopant at an interface with the second semiconductor nanocrystal shell,
wherein the first semiconductor nanocrystal shell comprises
a second layer adjacent to the second semiconductor nanocrystal shell,
a first layer adjacent to the semiconductor nanocrystal core, and
a third layer disposed between the first layer and the second layer, and
wherein the second layer comprises the polyvalent metal dopant and the third layer does not comprise the polyvalent metal dopant.

14. Core/shell quantum dots comprising
a semiconductor nanocrystal core comprising indium, phosphorus, and zinc; and
a first semiconductor nanocrystal shell disposed on the semiconductor nanocrystal core, the first semiconductor nanocrystal shell comprising zinc and selenium, and
a second semiconductor nanocrystal shell disposed on the first semiconductor nanocrystal shell, the second semiconductor nanocrystal shell comprising zinc and sulfur,
wherein a doped layer comprising a zinc chalcogenide and a polyvalent metal dopant is disposed between the first semiconductor nanocrystal shell and the second semiconductor nanocrystal shell, and
wherein the polyvalent metal dopant comprises, In, Sc, V, Cr, Mn, Fe, Hg, Sn, Pb, Ga, Bi, Sm, Eu, Dg, Tb, Dy, Ho, Er, Tm, Yb, Lu, or a combination thereof.

15. The core/shell quantum dots of claim 14, wherein the first semiconductor nanocrystal shell does not comprise a polyvalent metal dopant, the second semiconductor nanocrystal shell does not comprise a polyvalent metal dopant, or each of the first semiconductor nanocrystal shell and the second semiconductor nanocrystal shell does not comprise a polyvalent metal dopant.

16. The core/shell quantum dots of claim 14, wherein the doped layer is disposed directly on the first semiconductor nanocrystal shell and the second semiconductor nanocrystal shell is disposed directly on the doped layer.

17. The core/shell quantum dots of claim 14, wherein a maximum luminescent peak of the quantum dots is present in a range of greater than or equal to about 520 nanometers and less than or equal to about 540 nanometers.

18. The core/shell quantum dots of claim 14, wherein a maximum luminescent peak of the quantum dots has a full width at half maximum of less than or equal to about 40 nanometers, and the core/shell quantum dot has a quantum efficiency of greater than or equal to about 90%.

19. The core/shell quantum dots of claim 14, wherein
a mole ratio of zinc relative to indium is greater than or equal to about 18:1 and less than or equal to 30:1, a mole ratio of sulfur relative to selenium is less than or equal to 0.9:1, and a mole ratio of phosphorus relative to indium is less than or equal to about 0.75:1.

20. The core/shell quantum dots of claim 14, wherein a mole ratio of a total sum of selenium and sulfur relative to indium is greater than or equal to about 16:1 and less than or equal to about 40:1.

21. The core/shell quantum dots of claim 14, wherein the quantum dots have an average size of greater than or equal to about 5.5 nanometers and emit green light.

22. The core/shell quantum dots of claim 14, wherein the core/shell quantum dots do not comprise copper, manganese, aluminum, magnesium, gallium, antimony, hafnium, zirconium, titanium, or a combination thereof.

23. A display device comprising the core/shell quantum dots of claim 5.

* * * * *